(12) United States Patent
Heim

(10) Patent No.: US 8,183,739 B2
(45) Date of Patent: May 22, 2012

(54) ELECTROACTIVE POLYMER ACTUATED DEVICES

(75) Inventor: Jon Heim, Pacifica, CA (US)

(73) Assignee: Bayer MaterialScience AG, Leverkusen (DE)

( * ) Notice: Subject to any disclaimer, the term of this patent is extended or adjusted under 35 U.S.C. 154(b) by 430 days.

(21) Appl. No.: 11/933,277

(22) Filed: Oct. 31, 2007

(65) Prior Publication Data

US 2008/0116764 A1    May 22, 2008

Related U.S. Application Data

(63) Continuation of application No. 11/085,798, filed on Mar. 21, 2005, now Pat. No. 7,595,580.

(51) Int. Cl.
*H01L 41/08* (2006.01)
(52) U.S. Cl. .................................. 310/322; 310/800
(58) Field of Classification Search ............... 310/330, 310/309, 800, 371, 363, 320, 322, 324; 381/190, 381/152; *H01L 41/08*
See application file for complete search history.

(56) References Cited

U.S. PATENT DOCUMENTS

| | | | |
|---|---|---|---|
| 2,967,914 A | 1/1961 | Pye | |
| 4,283,649 A * | 8/1981 | Heinouchi | 310/324 |
| 4,284,921 A | 8/1981 | Lemonon et al. | |
| 4,605,167 A | 8/1986 | Maehara | |
| 4,654,554 A | 3/1987 | Kishi | |
| 4,911,057 A | 3/1990 | Fishman | |
| 5,085,401 A | 2/1992 | Botting et al. | |
| 5,900,572 A | 5/1999 | Aaroe | |
| 5,977,685 A | 11/1999 | Kurita et al. | |
| 6,161,966 A | 12/2000 | Chang et al. | |
| 6,336,880 B1 | 1/2002 | Agner | |
| 6,343,129 B1 | 1/2002 | Pelrine et al. | |
| 6,376,971 B1 | 4/2002 | Pelrine et al. | |
| 6,543,110 B1 | 4/2003 | Pelrine et al. | |
| 6,545,384 B1 | 4/2003 | Pelrine et al. | |
| 6,583,533 B2 | 6/2003 | Perline et al. | |
| 6,586,859 B2 | 7/2003 | Kornbluh et al. | |
| 6,617,759 B1 | 9/2003 | Zumeris et al. | |
| 6,628,040 B2 | 9/2003 | Pelrine et al. | |
| 6,664,718 B2 | 12/2003 | Pelrine et al. | |
| 6,690,101 B2 | 2/2004 | Magnussen et al. | |

(Continued)

FOREIGN PATENT DOCUMENTS

JP    2003-040041    *    2/2003

(Continued)

OTHER PUBLICATIONS

Roy Kornbluh ["Electro-elastomers: Applications of dielectric elastomer transducers for actuation, generation and smart structures," Smart Structures and Materials 2002: Industrial and Commercial Applications of Smart Structures Technologies, ed., A. McGowan, Proc.SPIE. 4698:254-270. 2002].*

(Continued)

*Primary Examiner* — Thomas Dougherty
*Assistant Examiner* — Karen B Addison
(74) *Attorney, Agent, or Firm* — John E. Mrozinski, Jr.

(57) ABSTRACT

Devices employing electroactive polymer actuators are disclosed. The devices include pumps, valves, cameras (where electroactive polymer actuators control either one or both of zoom and focus), vibrators (for inclusion in cell phones, game console controls, etc.) and audio speakers. These devices advantageously incorporate the actuator configurations described. The devices generally incorporate a diaphragm-type actuation having a central section of material that is less flexible than adjacent material.

5 Claims, 33 Drawing Sheets

U.S. PATENT DOCUMENTS

| | | | |
|---|---|---|---|
| 6,707,236 B2 | 3/2004 | Pelrine et al. | |
| 6,768,246 B2 | 7/2004 | Pelrine et al. | |
| 6,781,284 B1 | 8/2004 | Pelrine et al. | |
| 6,806,621 B2 | 10/2004 | Heim et al. | |
| 6,809,462 B2 | 10/2004 | Pelrine et al. | |
| 6,812,624 B1 | 11/2004 | Pei et al. | |
| 6,866,242 B2 | 3/2005 | Hirota | |
| 6,876,135 B2 | 4/2005 | Pelrine et al. | |
| 6,882,086 B2 | 4/2005 | Kornbluh et al. | |
| 6,891,317 B2 | 5/2005 | Pei et al. | |
| 6,911,764 B2 | 6/2005 | Pelrine et al. | |
| 6,940,211 B2 | 9/2005 | Pelrine et al. | |
| 7,034,432 B1 * | 4/2006 | Pelrine et al. | 310/309 |
| 7,037,270 B2 | 5/2006 | Seward | |
| 7,049,732 B2 | 5/2006 | Pei et al. | |
| 7,052,594 B2 | 5/2006 | Pelrine et al. | |
| 7,062,055 B2 | 6/2006 | Pelrine et al. | |
| 7,064,472 B2 | 6/2006 | Pelrine et al. | |
| 7,144,616 B1 | 12/2006 | Unger et al. | |
| 7,166,953 B2 | 1/2007 | Heim et al. | |
| 7,199,501 B2 | 4/2007 | Pei et al. | |
| 7,211,937 B2 | 5/2007 | Kornbluh et al. | |
| 7,224,106 B2 | 5/2007 | Pei et al. | |
| 7,233,097 B2 | 6/2007 | Rosenthal et al. | |
| 7,237,524 B2 | 7/2007 | Pelrine et al. | |
| 7,394,282 B2 | 7/2008 | Sinha et al. | |
| 7,923,982 B2 * | 4/2011 | Sumita | 324/72 |
| 2001/0026165 A1 | 10/2001 | Pelrine et al. | |
| 2001/0036790 A1 | 11/2001 | Kornbluh et al. | |
| 2002/0008445 A1 | 1/2002 | Pelrine et al. | |
| 2002/0050769 A1 | 5/2002 | Pelrine et al. | |
| 2002/0122561 A1 | 9/2002 | Pelrine et al. | |
| 2002/0130673 A1 | 9/2002 | Pelrine et al. | |
| 2002/0175594 A1 | 11/2002 | Kornbluh et al. | |
| 2002/0175598 A1 | 11/2002 | Heim et al. | |
| 2002/0185937 A1 | 12/2002 | Heim et al. | |
| 2003/0006669 A1 | 1/2003 | Pei et al. | |
| 2003/0067245 A1 | 4/2003 | Pelrine et al. | |
| 2003/0141787 A1 | 7/2003 | Pelrine et al. | |
| 2003/0214199 A1 | 11/2003 | Heim et al. | |
| 2004/0008853 A1 | 1/2004 | Pelrine et al. | |
| 2004/0046739 A1 | 3/2004 | Gettemy | |
| 2004/0124738 A1 | 7/2004 | Pelrine et al. | |
| 2004/0217671 A1 | 11/2004 | Rosenthal et al. | |
| 2004/0232807 A1 | 11/2004 | Pelrine et al. | |
| 2004/0263028 A1 | 12/2004 | Pei et al. | |
| 2005/0085693 A1 | 4/2005 | Belson et al. | |
| 2005/0157893 A1 | 7/2005 | Pelrine et al. | |
| 2005/0206271 A1 | 9/2005 | Higuchi et al. | |
| 2006/0000214 A1 | 1/2006 | Pelrine et al. | |
| 2006/0113878 A1 | 6/2006 | Pei et al. | |
| 2006/0119225 A1 | 6/2006 | Heim et al. | |
| 2006/0158065 A1 | 7/2006 | Pelrine et al. | |
| 2006/0208609 A1 | 9/2006 | Heim | |
| 2006/0208610 A1 | 9/2006 | Heim | |
| 2006/0238066 A1 | 10/2006 | Pelrine et al. | |
| 2006/0238079 A1 | 10/2006 | Pei et al. | |
| 2006/0290241 A1 | 12/2006 | Kornbluh et al. | |
| 2007/0040481 A1 | 2/2007 | Ogino | |
| 2007/0164641 A1 | 7/2007 | Pelrine et al. | |
| 2008/0157631 A1 | 7/2008 | Heim et al. | |

FOREIGN PATENT DOCUMENTS

| | | | |
|---|---|---|---|
| JP | 2004-221742 | * | 8/2004 |
| WO | WO 98/35529 | | 8/1998 |
| WO | WO 02/37660 | | 5/2002 |
| WO | WO 02/37892 | | 5/2002 |
| WO | WO 03/056274 | | 7/2003 |
| WO | WO 03/056287 | | 7/2003 |
| WO | WO 2004/027970 | | 4/2004 |
| WO | WO 2004/053782 | | 6/2004 |
| WO | WO 2004/074797 | | 9/2004 |
| WO | WO 2004/093763 | | 11/2004 |
| WO | WO 2006/102273 | | 9/2006 |

OTHER PUBLICATIONS

Kornbluh, R., et al., "Electroactive polymers: An emerging technology for MEMS," (invited) in MeEMS/MOEMS Components and Their Applications, eds. S. Janson, W. Siegfried, and A. Henning., Proc. SPIE, 5344:13-27, 2004.

Kornbluh, R., et al., "Electroelastomers: Applications of dielectric elastomer transducers for actuation, generation and smart structures," Smart Structures and Materials 2002: Industrial and Commercial Applications of Smart Structures Technologies, ed., A. McGowan, Proc. SPIE, 4698:254-270, 2002.

Kornbluh, R., et al., "Shape control of large lightweight mirrors with dielectric elastomer actuation," Actuation Smart Structures and Materials 2003: Electroactive Polymer Actuators and Devices, ed. Y. Bar-Cohen, Proc. SPIE, 5051, 2003.

Osterbacka, R. et al. "Two-Dimensional Electronic Excitations in Self-Assembled Conjugated Polymer Nanocrystals," Science, vol. 287:839-836, Feb. 4, 2000.

Pelrine, R., et al., "Applications of dielectric elastomer actuators," (invited paper) in Smart Structures and Materials 2001: Electroactive Polymer Actuators and Devices, ed., Y. Bar Cohen, Proc. SPIE, 4329:335-349, 2001.

* cited by examiner

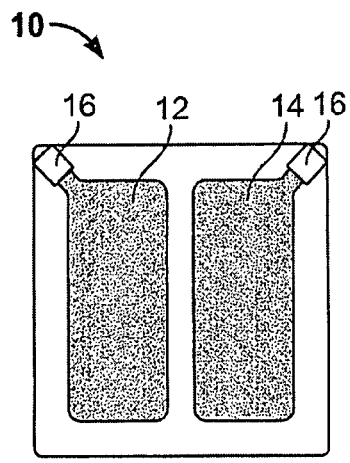
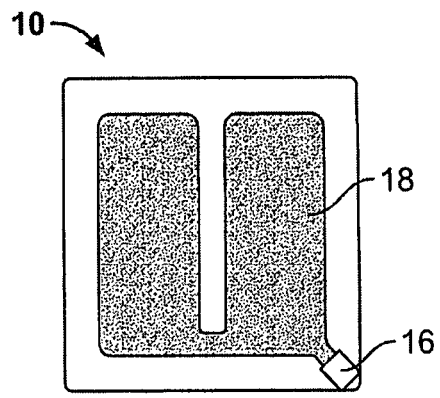
FIG. 1A
(Prior Art)
FIG. 1B
(Prior Art)
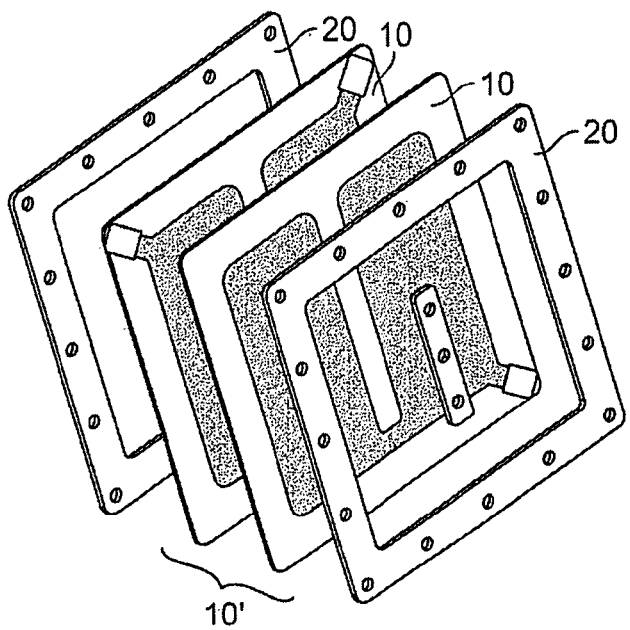
FIG. 2
(Prior Art)

ELECTROACTIVE POLYMER ACTUATED DEVICES

FIELD OF THE INVENTION

The present invention relates generally to devices driven by electroactive polymer actuators. More particularly, the present invention relates to pumps, valves, cameras, vibrators, audio speakers and other devices incorporating a diaphragm including a substantially rigid section driven by electroactive polymer material.

BACKGROUND

A tremendous variety of devices used today rely on actuators of one sort or another to convert electrical energy to mechanical energy. The actuators "give life" to these products, putting them in motion. Conversely, many power (veneration applications operate by converting mechanical action into electrical energy. Employed to harvest mechanical energy in this fashion, the same type of actuator may be referred to as a generator. Likewise, when the structure is employed to convert physical stimulus such as vibration or pressure into an electrical signal for measurement purposes, it may be referred to as a transducer. Yet, the term "transducer" may be used to generically refer to any of the devices. By any name, a new class of components employing electroactive polymers can be configured to serve these functions.

Especially for actuator and generator applications, a number of design considerations favor the selection and use of advanced electroactive polymer technology based transducers. These considerations include potential force, power density, power conversion/consumption, size, weight, cost, response time, duty cycle, service requirements, environmental impact, etc. Electroactive Polymer Artificial Muscle (EPAM™) technology developed by SRI International and licensee Artificial Muscle, Inc., excels in each of these categories relative to other available technologies. In many applications, EPAM™ technology offers an ideal replacement for piezoelectric, shape-memory alloy (SMA) and electromagnetic devices such as motors and solenoids.

As an actuator, EPAM™ technology operates by application of a voltage across two thin elastic film electrodes separated by an elastic dielectric polymer. When a voltage difference is applied to the electrodes, the oppositely-charged members attract each other producing pressure upon the polymer therebetween. The pressure pulls the electrodes together, causing the dielectric polymer film to become thinner (the z-axis component shrinks) as it expands in the planar directions (the x and y axes of the polymer film grow). Another factor drives the thinning and expansion of the polymer film. The like (same) charge distributed across each elastic film electrode causes the conductive particles embedded within the film to repel one another expanding the elastic electrodes and dielectric attached polymer film.

Using this "shape-shifting" technology, Artificial Muscle, Inc. is developing a family of new solid-state devices for use in a wide variety of industrial, medical, consumer, and electronics applications. Current product architectures include: actuators, motors, transducers/sensors, pumps, and generators. Actuators are enabled by the action discussed above. Generators and sensors are enabled by virtue of changing capacitance upon physical deformation of the material.

Artificial Muscle, Inc. has introduced a number of fundamental "turnkey" type devices can be used as building blocks to replace existing devices. Each of the devices employs a support or frame structure to pre-strain the dielectric polymer. It has been observed that the pre-strain improves the dielectric strength of the polymer, thereby offering improvement for conversion between electrical and mechanical energy by allowing higher field potentials.

Of these actuators, "Spring Roll" type linear actuators are prepared by wrapping layers of EPAM™ material around a helical spring. The EPAM™ material is connected to caps/covers at the ends of the spring to secure its position. The body of the spring supports a radial or circumferential pre-strain on the EPAM™ while lengthwise compression of the spring, offers axial pre-strain. Voltage applied causes the film to squeeze down in thickness and relax lengthwise, allowing the spring (hence, the entire device) to expand. By forming electrodes to create two or more individually addressed sections around the circumference, electrically activating one such section causes the roll extend and the entire structure to bend away from that side.

Bending beam actuators are formed by affixing, one or more layers of stretched EPAM™ material along the surface of a beam. As voltage is applied, the EPAM™ material shrinks in thickness and growth in length. The growth in length along one side of the beam causes the beam to bend away from the activated layer(s).

Pairs of dielectric elastomer films (or complete actuator packages such as the aforementioned "spring rolls") can be arranged in "push-pull" configurations. Switching voltage from one actuator to another shifts the position of the assembly back and forth. Activating opposite sides of the system makes the assembly rigid at a neutral point. So-configured, the actuators act like the opposing bicep and triceps muscles that control movements of the human arm. Whether the push-pull structure comprises film sections secured to a flat frame or one or more opposing spring rolls, etc, one EPAM™ structure can then be used as the biasing member for the other and vice versa.

Another class of devices situates one or more film sections in a closed linkage or spring-hinge frame structure. When a linkage frame is employed, a biasing spring will generally be employed to pre-strain the EPAM™ film. A spring-hinge structure may inherently include the requisite biasing. In any case, application of voltage will alter the frame or linkage configuration, thereby providing the mechanical output desired.

Diaphragm actuators are made by stretching EPAM™ film over an opening in a rigid frame. Known diaphragm actuator examples are biased (i.e., pushed in/out or up/down) directly by a spring, by an intermediate rod or plunger set between a spring and EPAM™, by resilient foam or air pressure. Biasing insures that the diaphragm will move in the direction of the bias upon electrode activation/thickness contraction rather than simply wrinkling. Diaphragm actuators can displace volume, making them suitable for use as pumps or loudspeakers, etc.

More complex actuators can also be constructed. "Inchworm" and rotary output type devices provide examples. Further description and details regarding the above-referenced devices as well as others may be found in the following patents and/or patent application publications:

U.S. Pat. No. 6,812,624 Electroactive polymers
U.S. Pat. No. 6,809,462 Electroactive polymer sensors
U.S. Pat. No. 6,806,621 Electroactive polymer rotary motors
U.S. Pat. No. 6,781,284 Electroactive polymer transducers and actuators
U.S. Pat. No. 6,768,246 Biologically powered electroactive polymer generators
U.S. Pat. No. 6,707,236 Non-contact electroactive polymer electrodes U.S. Pat. No. 6,664,718 Monolithic electroactive polymers
U.S. Pat. No. 6,628,040 Electroactive polymer thermal electric generators
U.S. Pat. No. 6,586,859 Electroactive polymer animated devices
U.S. Pat. No. 6,583,533 Electroactive polymer electrodes
U.S. Pat. No. 6,545,384 Electroactive polymer devices
U.S. Pat. No. 6,543,110 Electroactive polymer fabrication
U.S. Pat. No. 6,376,971 Electroactive polymer electrodes
U.S. Pat. No. 6,343,129 Elastomeric dielectric polymer film sonic actuator
20040217671 Rolled electroactive polymers
20040263028 Electroactive polymers
200402392807 Electroactive polymer transducers and actuators
20040217671 Rolled electroactive polymers
20040124738 Electroactive polymer thermal electric generators
20040046739 Pliable device navigation method and apparatus
20040008853 Electroactive polymer devices for moving fluid
20030214199 Electroactive polymer devices for controlling fluid flow
20030141787 Non-contact electroactive polymer electrodes
20030067245 Master/slave electroactive polymer systems
20030006669 Rolled electroactive polymers
20020185937 Electroactive polymer rotary motors
20020175598 Electroactive polymer rotary clutch motors
20020175594 Variable stiffness electroactive polymer systems
20020130673 Electroactive polymer sensors
20020050769 Electroactive polymer electrodes
20020008445 Energy efficient electroactive polymers and electroactive polymer devices
20020122561 Elastomeric dielectric polymer film sonic actuator
20010036790 Electroactive polymer animated devices
20010026165 Monolithic electroactive polymers Each of these publications is incorporated herein by reference in its entirety for the purpose of providing background and/or further detail regarding underlying technology and features as may be used in connection with or in combination with the aspects of present invention set forth herein.

While the devices described above provide highly functional examples of EPAM™ technology transducers, there continues to be an interest in developing more efficient EPAM™ transducers. The gains in efficiency offered by transducers according to the present invention may come in terms of preloading improvement, interface with driven/driving components, output, manufacturability, etc. Those with skill in the art will appreciate the applicable advantages.

SUMMARY OF THE INVENTION

The present invention offers a number of EPAM™ transducer designs to augment the line of "turn-key" tools offered by the assignee hereof (Artificial Muscle, Inc.). The designs all share the requirement of a frame or fixture element used in preloading the elastomeric film electrodes and dielectric polymer in a desired configuration.

Certain of the embodiments include push-pull subassemblies. Aspects of the invention may incorporate a complex frame structure to marry different types of actuators. Another aspect of the invention includes frame structures with alternative push-pull actuator configurations for in-plane and/or out-of-plane input/output. Still other aspects of the invention are directed toward producing more robust and/or easily manufactured actuator structures. In this regard, frustum-shaped diaphragm actuators are produced in which the top of the structure includes a cap. The cap may be a solid disc, annular or otherwise constructed. The cap provides a stable interface between opposing frustums and/or for a mechanical preloaded element such as a spring. Also included in the invention are advantageous applications for the subject transducer structures.

One such application is for a pump. The pump may use a single-frustum actuator or a double-frustum actuator design. In the former case, the frustum cap provides a stable surface against which to mechanically bias the structure. Such a structure can be made very robust as well as compact. A double-frustum design requires no additional preload source. Further, it may be configured to serve as a double-acting pump. In addition, use of two actuators arranged in series offers the potential to double the stroke. Other in-series actuator arrangements are contemplated in the present invention as well.

Another application is for a camera in which, lens position is manipulated by a frustum-type actuator. Again, either a single or double-frustum design may be employed. A double frustum approach may be desirable from the perspective of using one of the sides for position sensing and preload, and another for actuation. Another camera application uses the complex frame in which a frustum-type actuator controls lens position and one or more planar actuator sections control zoom.

Other potential applications of the subject transducers include valves, or valve control components, speaker diaphragms, multi-axis position sensors/joysticks, vibrators, haptic or force feedback control devices, multi-axis actuators, etc.

A "frustum" is technically the portion of a geometric solid that lies between two parallel planes A frustum is often regarded as the basal part of a cone or pyramid formed by cutting off the top by a plane, typically, parallel to the base. Naturally, frustum-type actuators according to the invention may be in the form of a truncated cone, thereby having a circular cross-section, or may employ a variety of cross-sectional configurations Depending on their application, desirable alternative cross-sectional geometries include triangular, square, pentagonal, hexagonal, etc. Often, symmetrically shaped members will be desirable from the perspective of consistent material performance. However, ovaloid, oblong, rectangular or other shapes may prove better for a given application—especially those that are space-constrained. Further variation of the subject "frustum" transducers is contemplated in that the top and/or bottom of the form(s) need not be flat or planer, nor must they be parallel. In a most general sense, the "frustum" shape employed in the present invention may be regarded as a body of volume that is truncated or capped at an end. Often this end is the one having the smaller diameter or cross-sectional area.

The various devices describe may be driven by the specific actuators described herein or by others. Yet, all of the devices incorporate a diaphragm in their design. Advantageously, the actuator cap and device diaphragm are one in the same, thereby integrating the subassemblies.

BRIEF DESCRIPTION OF THE DRAWINGS

The figures illustrate exemplary aspects of the invention. Of these figures:

FIGS. 1A and 1B show opposite sides of an EPAM™ layer;

FIG. 2 is an assembly view of an EPAM™ layer stack;

DETAILED DESCRIPTION OF THE INVENTION

Figure 3:
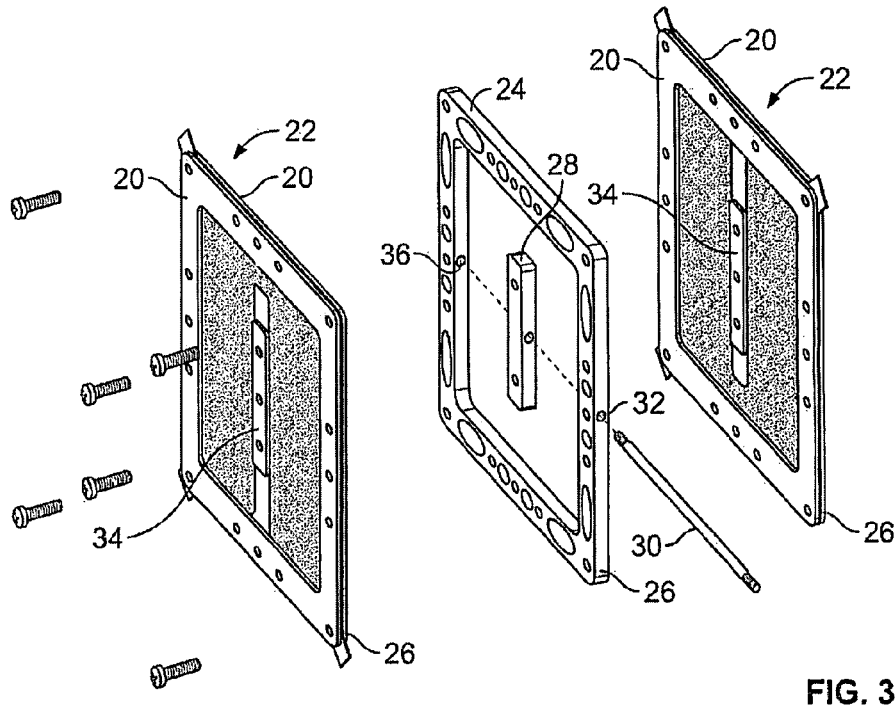
FIG. 3 is an assembly view of an EPAM™ planar actuator.

Various exemplary embodiments of the invention are described below. A number of actuator/transducer embodiments are first described. Next, systems optionally incorporating such devices are described. Finally, manufacturing techniques and applicable methods of use and kits are described, followed by discussion of contemplated variations. Reference is made to these examples in a non-limiting sense. They are provided to illustrate more broadly applicable aspects of the present invention.

Transducers

FIGS. 1A and 1B show opposite sides of an EPAM™ layer 10. The layer comprises dielectric polymer sandwiched between elastic thin film electrodes. FIG. 1A shows the side of the layer patterned with "hot" electrodes 12 and 14. Each electrode is connected to a lead 16. FIG. 1B shows the opposite side of layer 10 patterned with a common "ground" electrode 18 connected to a single lead 16.

As shown in FIG. 2, multiple film layers 10 are stacked and held in a stretched state within frame pieces 20. A number of individual EPAM™ layers 10 are advantageously stacked to form a compound layer 10'. Doing so amplifies the force potential of the system. The number of layers stacked may range from 2 to 10 or more. Generally, it will be desired to stack an even number of layers so that ground electrodes are facing any exposed surfaces to provide maximum safety. In any case, the EPAM™ layer or layers may collectively be referred to as EPAM™ "film".

With one or more layers of material secured in a frame, the frame may be used to construct a complex transducer mechanism. FIG. 3 shows one such construction known in the art. Here, individual cartridge sections 22 are secured to a secondary or body frame portion 24. Any film frames and intermediate frame member are joined to provided a combined (i.e., attached with fasteners as shown, bonded together, etc.) frame structure 26. A spacer 28 provides an interface for an input/output rod 30 received by the frame through guide hole 32. The spacer is attached to the film via complementary mounts 34 bonded to or clamped the EPAM™ film with the spacer.

To actuate a device constructed according to FIG. 3, voltage is applied to either one of electrodes 12 or 14. By applying voltage to one side, that side expands, while the other relaxes its preload and contracts. Other modes of actuation are referenced to above.

Figure 4A:
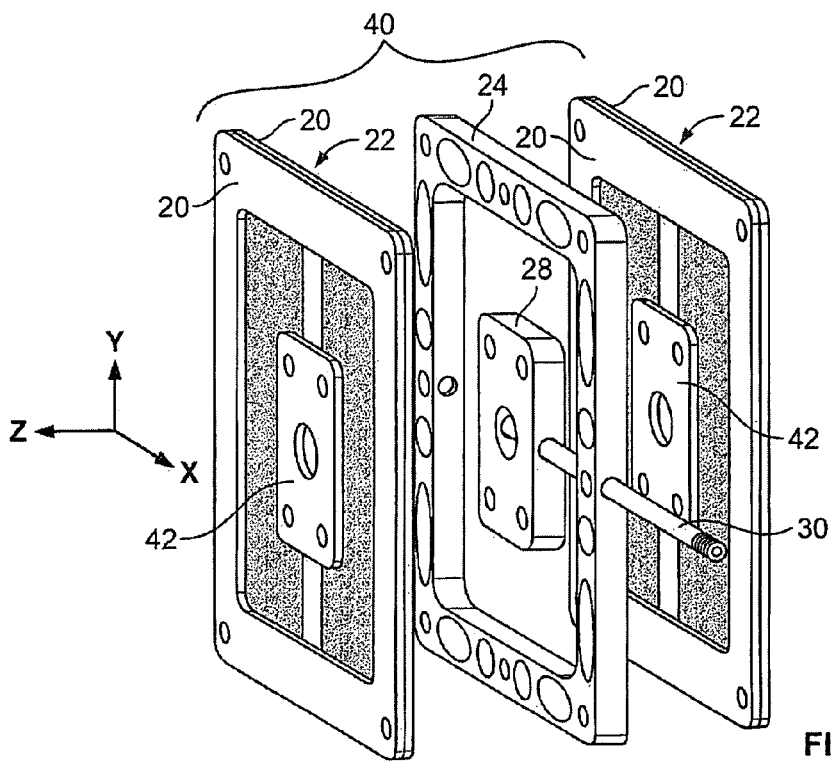
FIGS. 4A and 4B are assembly and perspective views, respectively, of a planar transducer configuration.
Figure 4B:
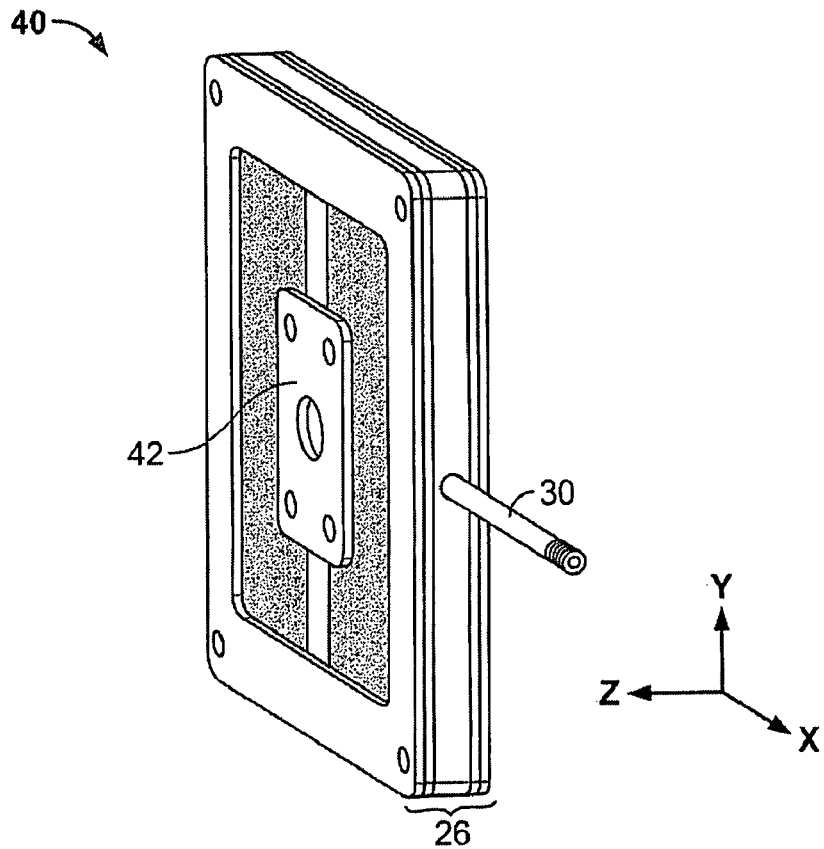

A first device according to the present invention can be similarly configured and operated. FIGS. 4A and 4B provide assembly and perspective view of a transducer 40 according to the present invention that can alternatively be configured for planar actuation (as the device is in FIG. 3) and out-ofplane actuation. As with the device described in reference to the previous figures, frames 20 carry layers 10/10' with ground electrodes facing outward.

Again, individual cartridge sections 22 are stacked with a secondary frame 24 and spacer 26 therebetween, with the spacer providing an interface for an input/output rod 28 received by the frame. However, spacer 26 in this configuration is to be attached to a substantially square-shaped cap 42 elements. A more symmetrical interface portion offers advantages as will be explained below. FIG. 48 shows the assembled device. Here frame 26 is shown as a complete unit.

Figure 5:
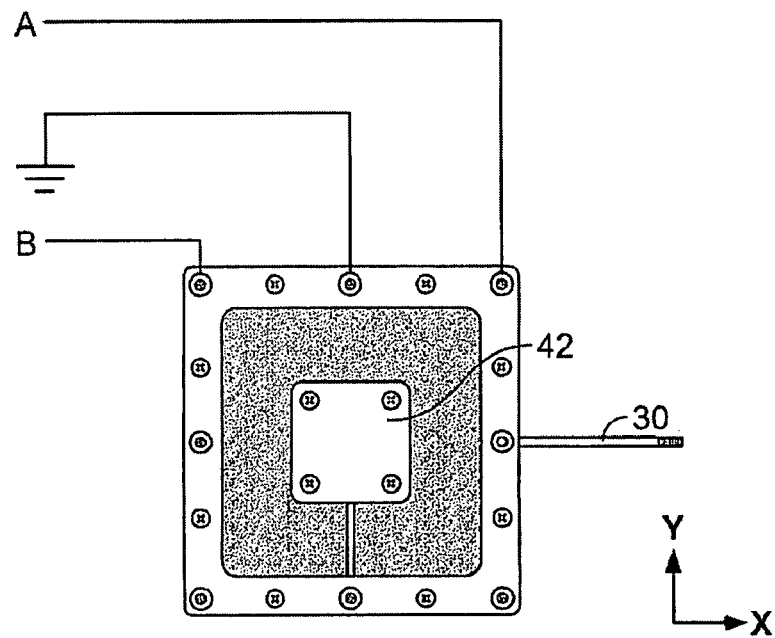
FIG. 5 is a top view of a the device in FIGS. 4A and 4B electrically connected for planar actuation.

As for actuation of the device, FIG. 5 shows a basic circuit diagram in which A and B sides of the circuit are powered relative to ground to cause back and forth movement of rod 30 along an X-axis relative to frame.

Figure 6A:
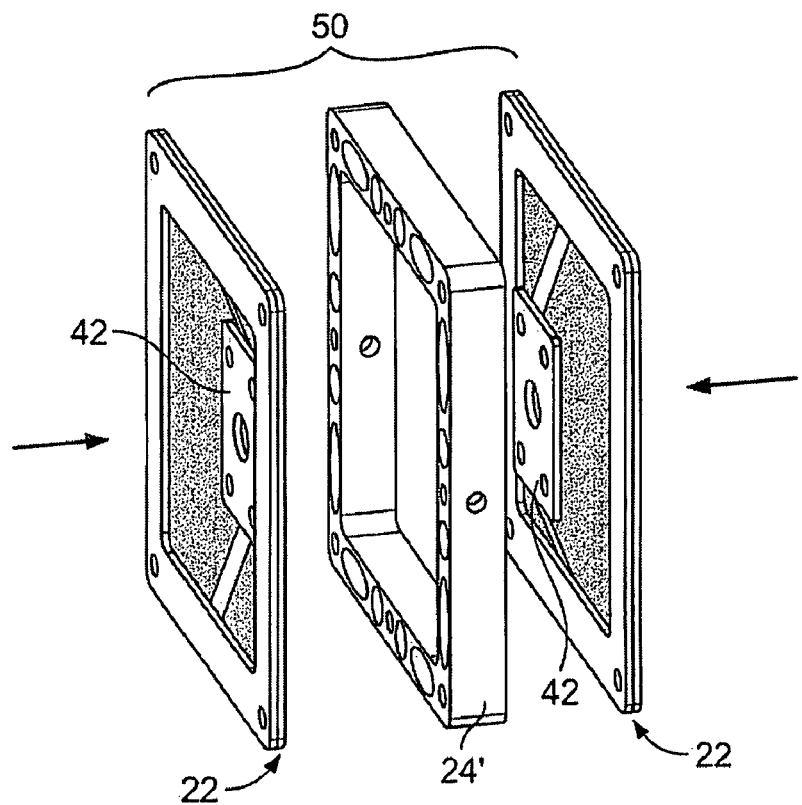
FIGS. 6A and 6B are assembly and perspective views, respectively, of the transducer in FIGS. 4A and 4B setup in an alternate, frustum configuration for out-of-plane actuation.
Figure 6B:
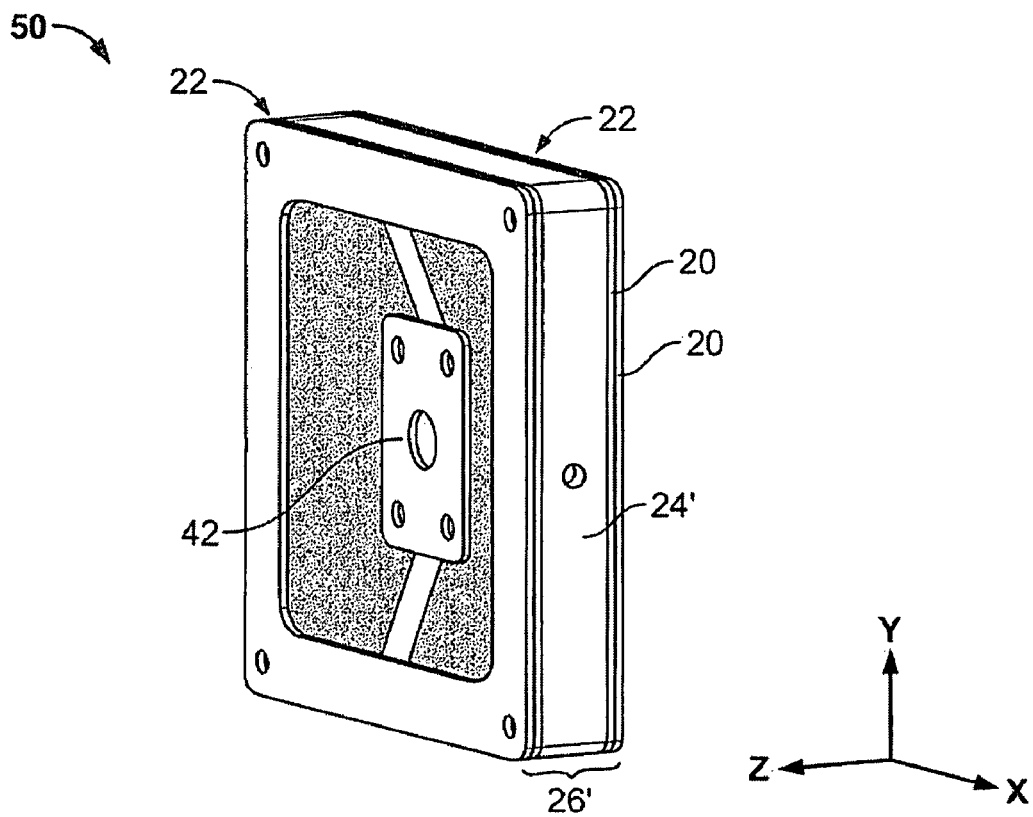

Yet, in an alternative configuration, the same EPAM™ layer cartridges can be used to produce a transducer adapted for out-of-plane or Z-axis input/output. FIGS. 6A and 6B illustrate such a device. Here transducer 50 assembly may employ a thicker body frame 24'. By employing such a frame and by omitting spacer, when caps 42 are secured to one another, they produce deeply concave forms 52 facing opposite or away from one another. To actuate the transducer for simple Z-axis motion, one of the concave/frustum sides is expanded by applying voltage while the other side is allowed to relax. Such action increases the depth of one cavity 52 while decreasing that of the other. In the simplest case, the motion produced is generally perpendicular to a face of the cap.

Figure 7A:
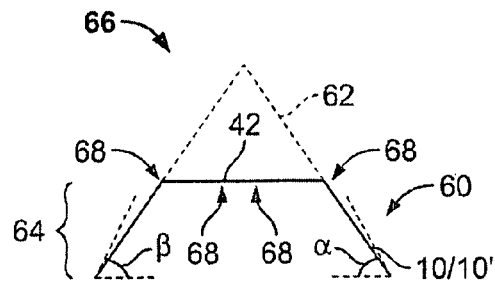
FIGS. 7A-7C diagrammatically illustrate the geometry and operation of frustum-shaped actuators.
Figure 7B:
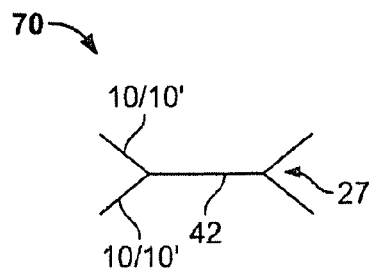
Figure 7C:
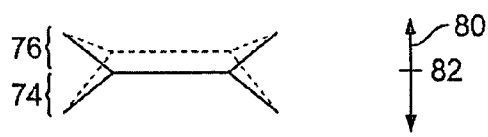

FIGS. 7A-7C diagrammatically illustrate the manner in which these concave/convex or frustum shaped actuators function in a simplified two dimensional model. FIG. 7A illustrates the derivation of the transducer frustum shape. Whether conical, squared, ovaloid, etc. when viewed from above, from the side a truncated form 60 is provided by modifying existing diaphragm actuator configurations by capping the top (or bottom) of the structure. When under tension, the cap 42 alters the shape the EPAM™ layer/layers 10/10' would take. On the example where a point load stretches the film, the film would assume a conical shape (as indicated by dashed lines define a triangular top 62). However, when capped or altered to form a more rigid top structure, the form is truncated as indicated in solid lines 64 in FIG. 7A.

So-modifying the structure fundamentally alters its performance. For one, it distributes stress that would otherwise concentrate at the center of structure 66 around a periphery 68 of the body instead. In order to effect this force distribution, the cap is affixed to the EPAM™ layers. An adhesive bond may be employed. Alternatively, the constituent pieces may be bonded using any viable technique such as thermal bonding, friction welding, ultrasonic welding, or the constituent pieces may be mechanically locked or clamped together. Furthermore, the capping structure may comprise a portion of the film that is made substantially more rigid through some sort of thermal, mechanical or chemical techniques—such as vulcanizing.

Generally, the cap section will be sized to produce a perimeter of sufficient length to adequately distribute stress applied to the material. The ratio of size of the cap to the diameter of the frame holding the EPAM™ layers may vary. Clearly, the size of disc, square, etc. employed for the cap will be larger under higher stress/force application. The relative truncation of the structure (as compared to point-loaded cones, pressure biased domes, etc.) is of further importance to reduce volume the aggregate volume or space the transducer occupies in use, for a given amount of pre-stretch to the EPAM™ layers.

Furthermore, in a frustum type diaphragm actuator, the cap or diaphragm 42 element may serve as an active component (such as a valve seat, etc. in a given system).

With the more rigid or substantially cap section formed or set in place, when EPAM™ material housed by a frame is stretched in a direction perpendicular to the cap (as seen by comparing the EPAM/frame configurations as shown in FIGS. 4N4B and 6N6B), it produces the truncated form. Otherwise the EPAM™ film remains substantially flat or planar.

Returning to FIG. 7A, with the cap 42 defining a stable top/bottom surface, the attached EPAM™ polymer sides 10/10' of the structure assume an angle. The angle a the EPAM™ is set at when not activated may range between 15 and about 85 degrees. More typically it will range from about 30 to about 60 degrees. When voltage is applied so that the EPAM™ material is compressed and grows in its planar dimensions, it assumes a second angle β in about the same range plus between about 5 and 15 degrees. Optimum angles may be determined based on application specifications.

Single-sided frustum transducers are within the contemplated scope of the present invention as well as double-sided structures. For preload, single sided devices employ any of a spring interfacing with the cap (e.g., a coil, a constant force or roll spring, leaf spring, etc.), air or fluid pressure, magnetic attraction, a weight (so that gravity provides preload to the system), or a combination of any of these means or others.

In double-sided frustum transducers, one side typically provides preload to the other. Still, such devices may include additional bias features/members. FIG. 7B illustrates the basic "double-frustum" architecture 701. Here, opposing layers of EPAM™ material or one side of EPAM™ film and one side of basic elastic polymer are held together under tension along an interface section 72. The interface section often comprises one or more rigid or semi-rigid cap element(s) 42. However, by adhering two layers of the polymer together at their interface, the combined region of material, alone, offers a relatively stiffer or less flexible cap region in the most basic manner to offer a stable interface portion of the transducer.

However constructed, the double-frustum transducer operates as shown in FIG. 7B. When one film side 74 is energized, it relaxes and pulls with less force, releasing stored elastic energy in the bias side 74 and doing work through force and stroke. Such action is indicated by dashed line in FIG. 78. If both film elements comprise EPAM™ film, then the actuator can move in/out or up/down relative to a neutral position (shown by solid line in each of FIGS. 7A and 7B) as indicated by double-headed arrow 80.

If only one active side 74/76 is provided, forced motion is limited to one side of neutral position 82. In which case, the non-active side of the device may simply comprise elastic polymer to provide preload/bias (as mentioned above) or EPAM™ material that is connected electrically to sense change in capacitance only or to serve as a generator to recover motion or vibration input in the device in a regenerative capacity.

Figure 8:
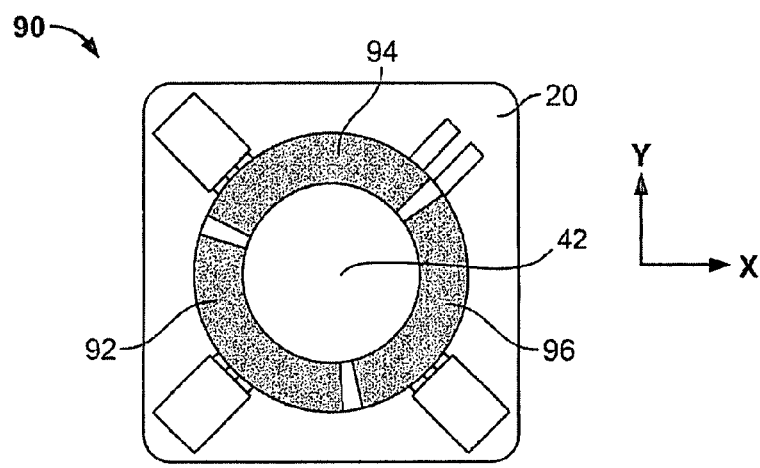
FIG. 8 is a top view of a multi-phase frustum-shaped actuator.

Further optional variation for transducers according to the present invention includes provision for multi-angle/axis sensing or actuation. FIG. 8 shows a circular EPAM™ cartridge 90 configuration with three (92, 94, 96) independently addressable zones or phases. When configured as an actuator, by differential voltage application, the sections will expand differently causing cap 42 to tilt on an angle. Such a multi-phase device can provide multi-directional tilt as well as translation depending on the manner of control. When configured for sensing, input form a rod or other fastener or attachment to the cap causing angular deflection can be measured by way of material capacitance change.

Figure 9A:
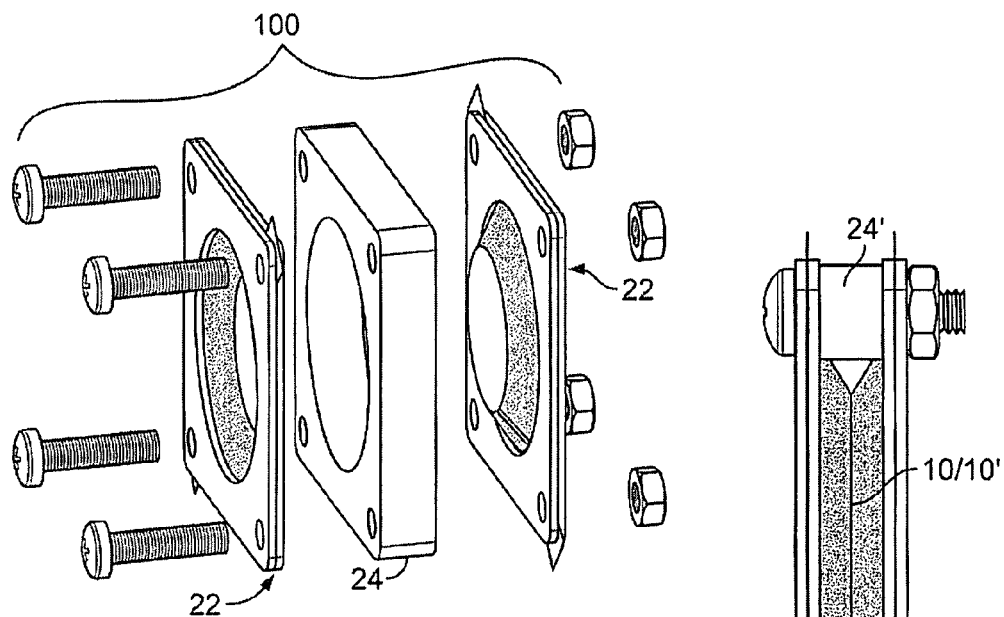
FIG. 9A is an assembly view of another frustum shaped actuator.
Figure 9B:
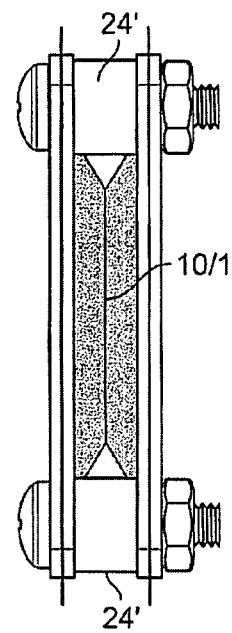
FIG. 9B is a side view the same basic actuator with an alternate frame construction.

The EPAM™ section shown in FIG. 8 is round. FIG. 9A provides an assembly view of a round-frustum transducer 100. The body frame member 24 employed is solid, resembling that used in the combination or convertible type actuator shown in FIGS. 4A-6B above. However, the device shown in FIG. 9A is a dedicated diaphragm type actuator (though it may employ a multiphase structure shown in FIG. 8). An alternative construction for such an actuator is shown in FIG. 9B. Here, the monolithic frame element 24 is replaced by simple frame spacers 24".

Figure 10:
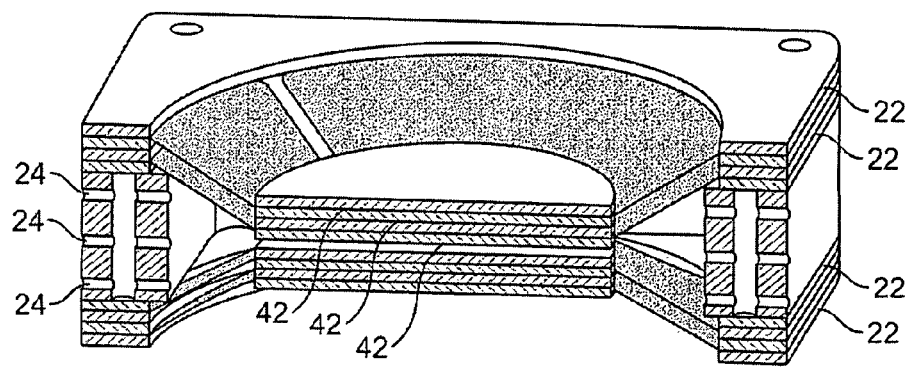
FIG. 10 is a sectional perspective view of a parallel-stacked type of frustum transducer.

FIG. 10 shows another construction variation in which the transducer comprises multiple cartridge layers 22 on each side of a double-frustum device 100. Individual caps 42 are ganged or stacked together. To accommodate the increased thickness, multiple frame sections 24 may likewise be stacked upon one another.

Recall that each cartridge 22 may employ compound EPAM™ layers 10'. Either one or both approaches—together—may be employed to increase the output potential of the subject device. Alternatively, at least one cartridge member in the of the stack (on either one or both sides of the device) may be setup for sensing as opposed to actuation to facilitate active actuator control or operation verification. Regarding such control, any type of feedback approach such as a PI or PID controller may be employed in such a system to control actuator position with very high accuracy and/or precision.

Figure 11:
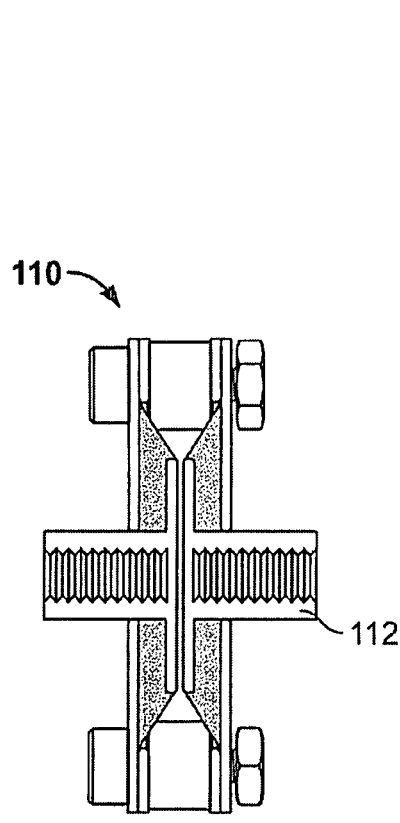
FIG. 11 is a side-section view showing an optional output shaft arrangement with a frustum type transducer.

FIG. 11 is a side-section view showing an optional output shaft arrangement with a frustum type transducer 110. Threaded bosses 112 on either side of the cap pieces provide a means of connection for mechanical output. The bosses may be separate elements attached to the cap(s) or may be formed integral therewith. Even though an internal thread arrangement is shown, external threaded shaft may be employed. Such an arrangement may comprise a single shaft running through the cap(s) and secured on either side with a nuts in a typical jam-nut arrangement. Other fastener or connection options are possible as well.

Figure 12:
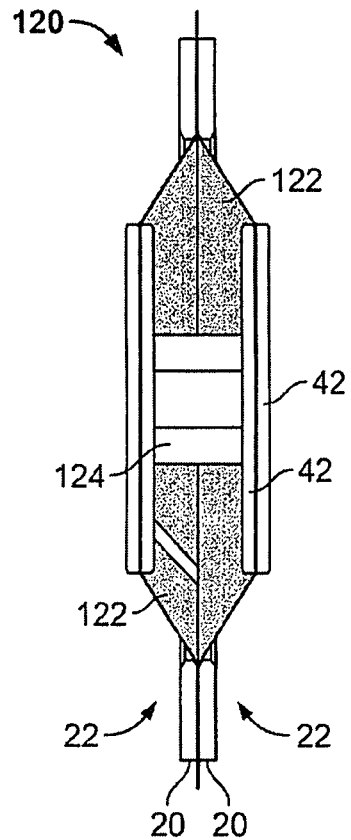
FIG. 12 is a side-section view of an alternate, inverted frustum transducer configuration.

FIG. 12 is a side-section view of an alternate transducer 120 configuration, in which instead of employing two concave structures facing away from one another, the two concave/frustum sections 122 face towards each other. The preload or bias on the EPAM™ layers to force the film into shape is maintained by a shim or spacer 124 between caps 42. As shown, the space comprises an annular body. The caps may too include all opening in this variation of the invention as well as others. Note also that the inward-facing variation of the invention in FIG. 12 does not require an intermediate frame member 24 between individual cartridge sections 22. Indeed, the EPAM™ layers on each side of the device can contact one another. Thus, in situations where mounting space is limited, this variation of the invention may offer benefits. Further uses of this device configuration are also discussed below. Other biasing approaches for frustum-type actuators are, however, first described.

Figure 13:
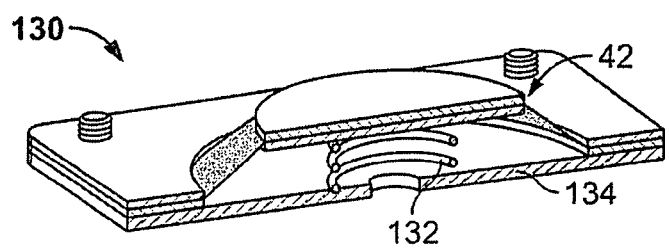
FIG. 13 is a sectional perspective view of a coil spring-biased single frustum transducer.
Figure 14:
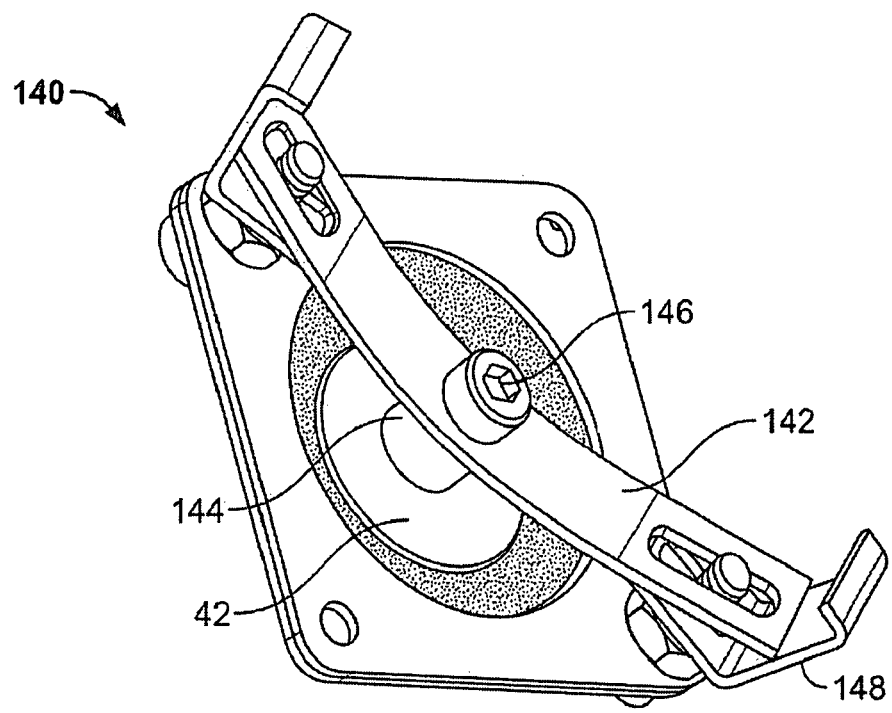
FIG. 14 is a perspective view of a leaf spring-biased single frustum transducer.
Figure 15:
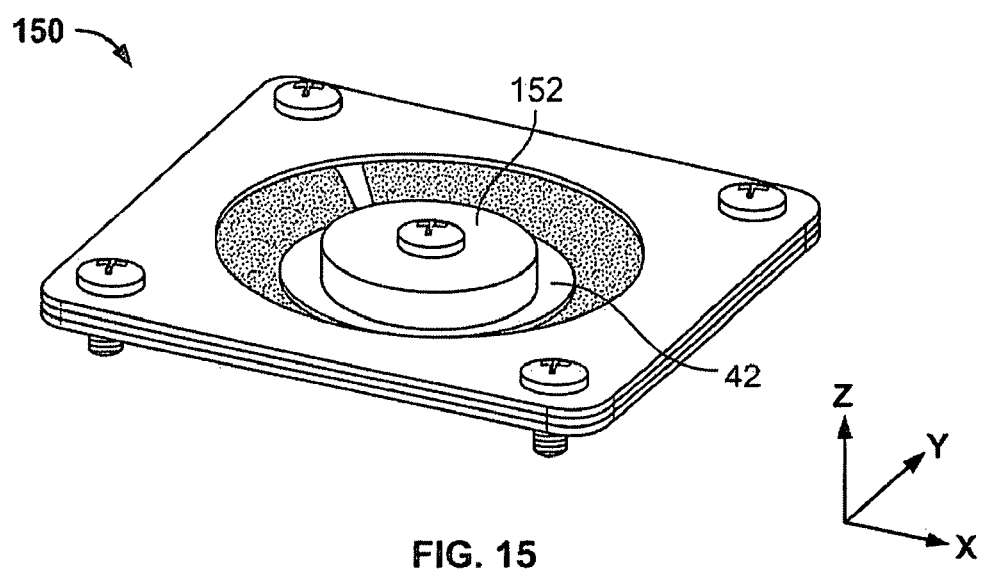
FIG. 15 is a perspective view of a weight-biased single frustum transducer.

Specifically, FIG. 13 provides a sectional perspective view of a coil spring-biased single frustum transducer 130. Here, a coil spring 132 interposed between cap 427 and a baffle wall 134 associated with the frame (or part of the frame itself) biases the EPAM™ structure. In the transducer 140 shown in FIG. 14, a leaf spring 142 biases the cap portion of a transducer. The leaf spring is shown attached to a boss 144 by a bolt 146 or a spacer captured between the bolt and a nut (not shown) on the other side of the cap. The ends of the leaf are guided by rails 148. In another transducer example 150 illustrated by FIG. 15 the EPAM™ film may be biased by a simple weight 152 attached to or formed integral with the cap(s) 42. Though the device is shown tilted up for the sake of viewing, it will typically be run flat so that the pull of gravity on the weight symmetrical biases the transducer along a Z-axis.

Based on the above, it should be apparent that any number of parameters of the subject transducers can be varied to suit a given application. A non-exhaustive list includes: the output fastener or connection means associated with the cap (be it a threaded boss, spacer, shaft, ring, disc, etc.); prestrain on the EPAM™ film (magnitude, angle or direction, etc.); film type (silicone, acrylic, polyurethane, etc.); film thickness; active vs. non-active layers; number of layers; number of film cartridges; number of phases; number of device "sides" and direction of device sides.

Systems

Figure 16:
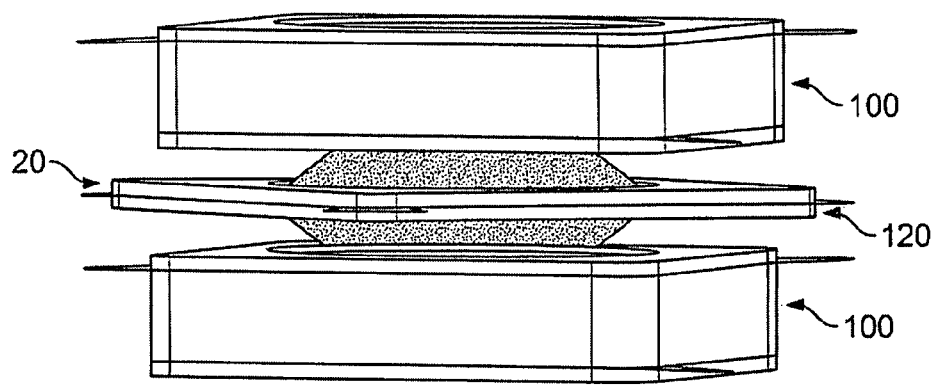
FIG. 16 is a perspective view of frustum-type transducers provided in series for stroke amplification.

Any of the subject transducers can be employed in more complex assemblies. FIG. 16 provides a transducer example 160 in which a number of frustum-type transducer subunits 100 are stacked in series for stroke amplification. What is more, an inward facing double-frustum transducers 120 offers a second output phase through attachment to its frame 20. While the height of this member is stable due to its internal space (referenced above), the position of its frame is mobile to provide second stage output or input.

Instead of a center stage 120, a simple spacer may be employed between the outer transducers 100 for basic stroke amplification purposes. To further increase stroke, then, another such stack may be set on the first, etc. To offer another stage of actuation, another inward-facing transducer may be employed, etc. Yet another variation contemplates pairing an inward facing transducer with an outward facing transducer in actuator sensor pairs. Naturally, other combinations are within the scope of the present invention.

Figure 17:
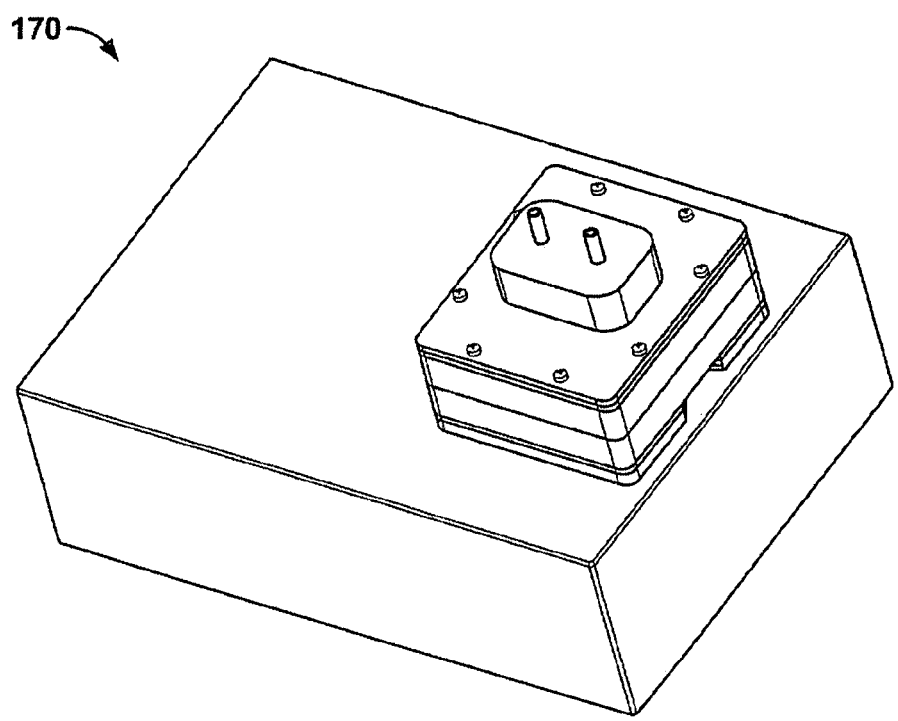
FIG. 17 is a perspective view of a reconfigurable exploratory system offer in transducers of various types.
Figure 18A:
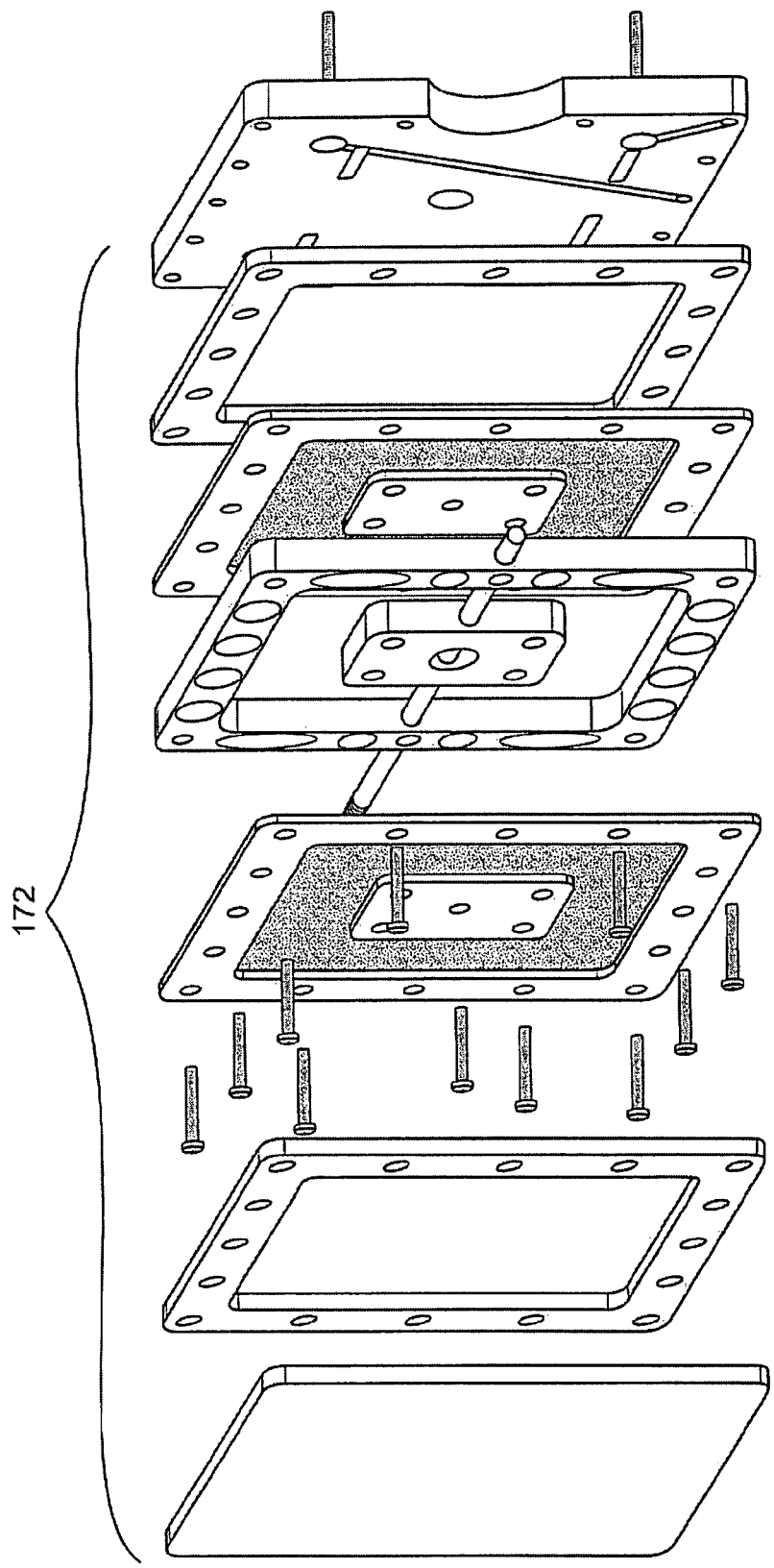
FIGS. 18A-18C are assembly views of various alternative configurations for the system in FIG. 17.
Figure 18B:
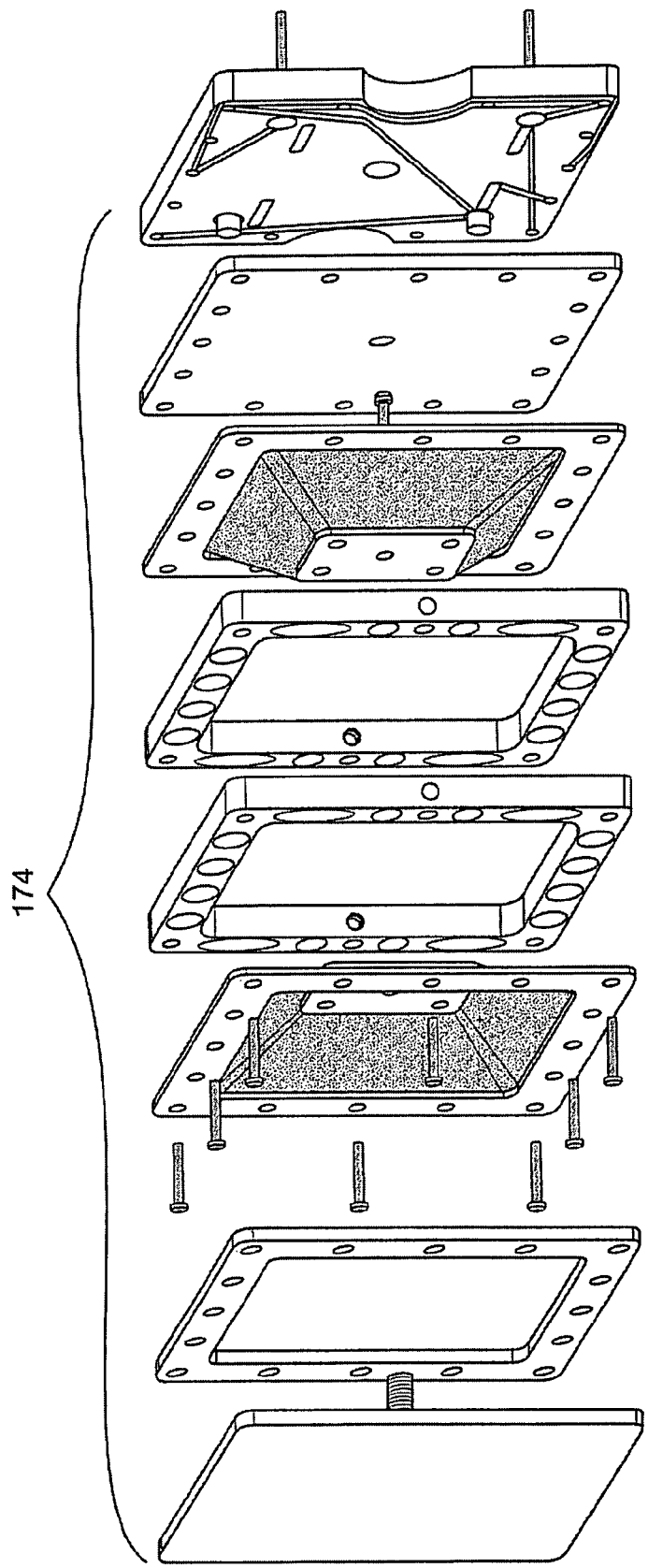
Figure 18C:
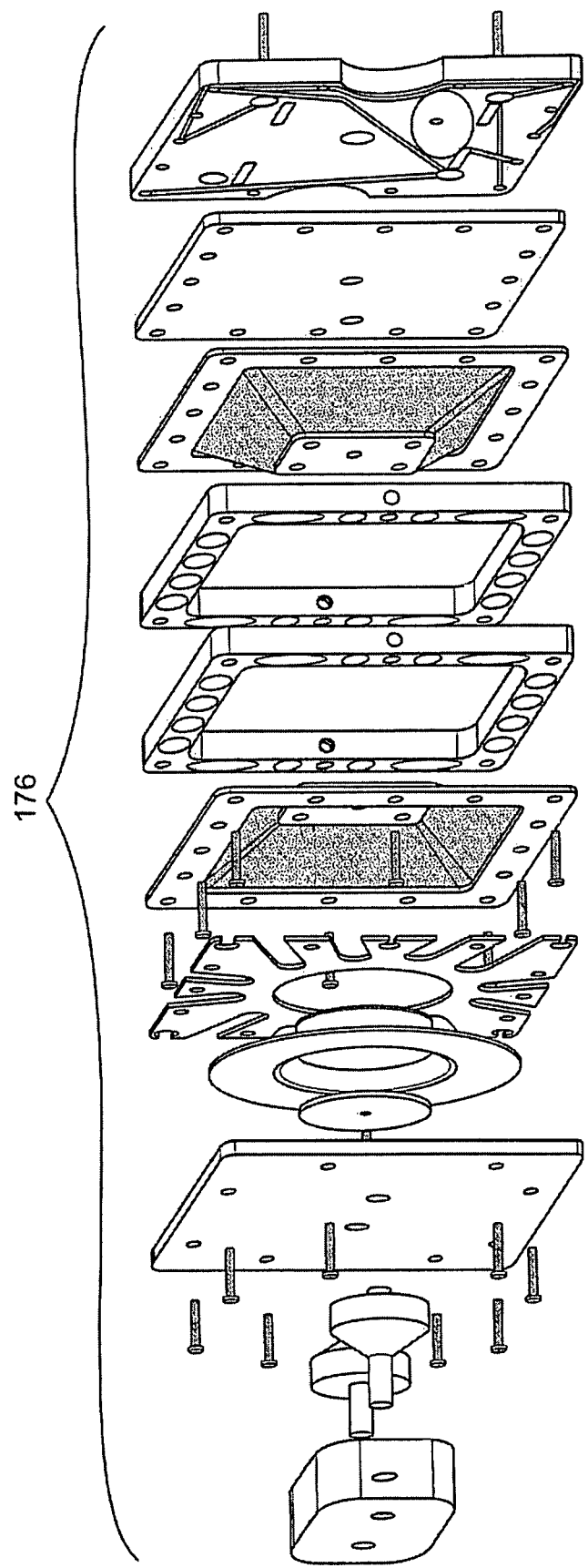

Another highly flexible problem-solving or experimental approach offered by the present invention is illustrated in connection with FIG. 17. Here a reconfigurable exploratory system 170 is shown that offers transducers of various types. FIGS. 18A-18C provide assembly views of various alternative configurations for the system in FIG. 17. With a component stack arrangement 172 as shown in FIG. 18A, system 170 is adapted to serve as a planar actuator. With a component stack arrangement 174 as shown in FIG. 18B, system 170 is adapted to serve as a diaphragm actuator. With a component stack arrangement 176 as shown in FIG. 18C, system 176 is adapted to operate as a diaphragm pump. Such a pump is described in further detail below. As for system 170, suffice it to say, here, that the subject architecture lends itself to tremendous flexibility.

Figure 19A:
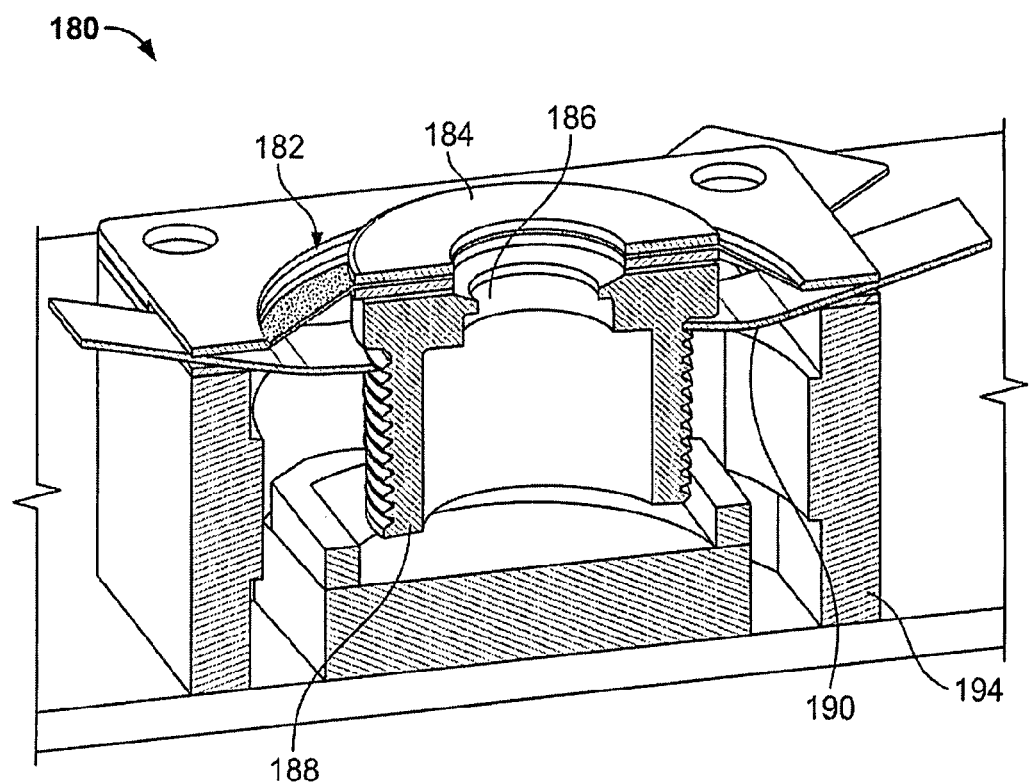
FIG. 19A is a sectional perspective view of a camera lens assembly employing an frustum actuator for control focus.

FIG. 19A provides a view of another application employing the present invention. The figure details a camera lens assembly 180 employing a frustum-type actuator 182 to control focus. The cap or diaphragm of the transducer 184 is open in the shape of a ring for light to pass to a lens 186 the may be set in a housing 188. A leaf spring 190 is shown in contact with the housings to bias the EPAM™ film.

Figure 19B:
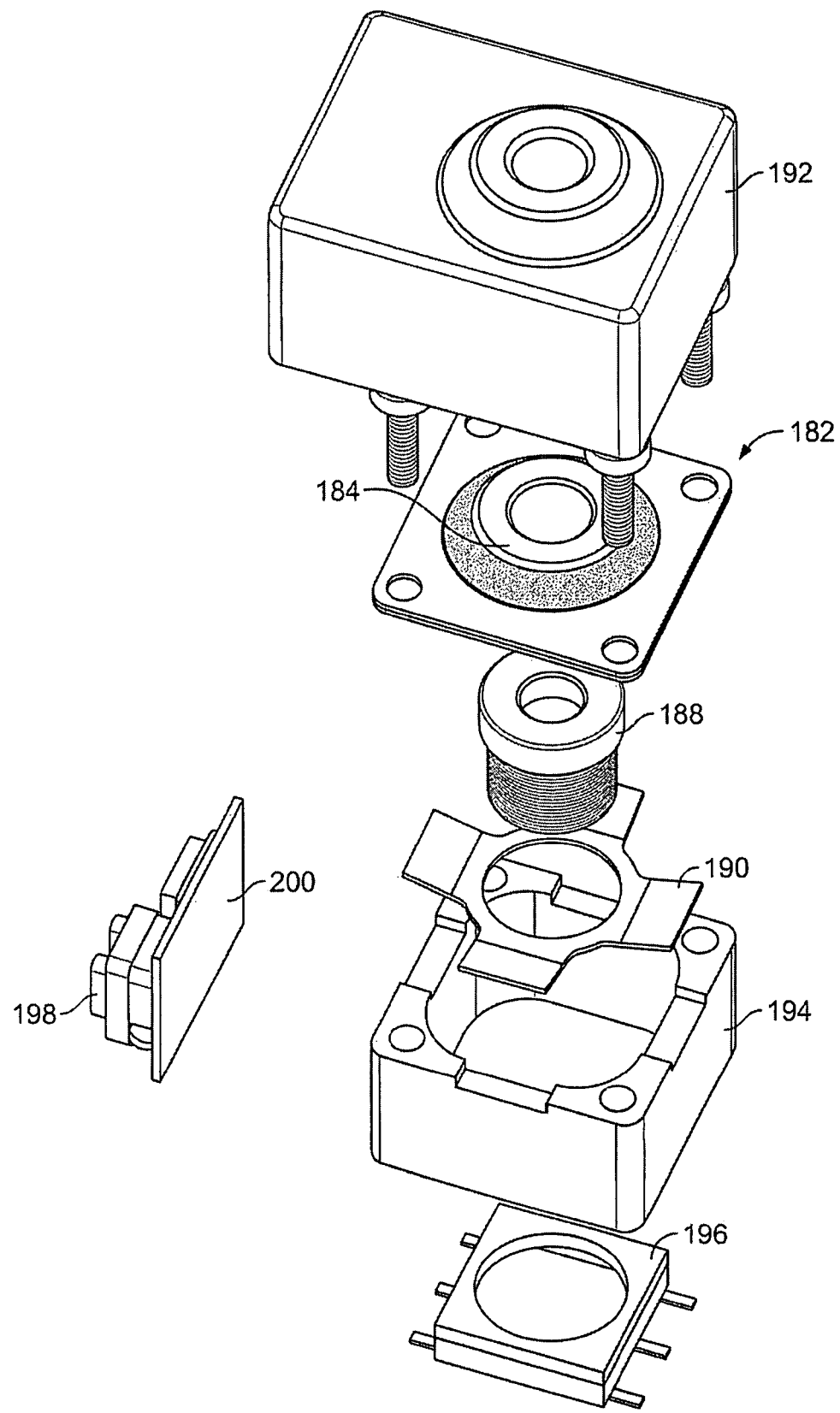
FIG. 19B is an assembly view of camera components with the system shown in FIG. 19A.

As shown in FIG. 19B, a completed camera assembly will include at least a shroud or cover 192, internal frame component(s) 194, a CCD 196 (Charge-Couple Device) for image capture and electronics 198. The electronics may be integrated to drive the entire device, or the electronics on board 200 may simply provide the voltage step-up and control required for the EPAM™ actuator.

Suitable power supply modules for such use include EMCO High Voltage Corp. (California) Q, El F, G models and Pico Electronics, Inc. (New York) Series V V units. Naturally, a custom power supply could be employed. In any case, the referenced power supplies may be employed not only in the camera embodiments, but any system incorporating the subject transducers.

Figure 20:
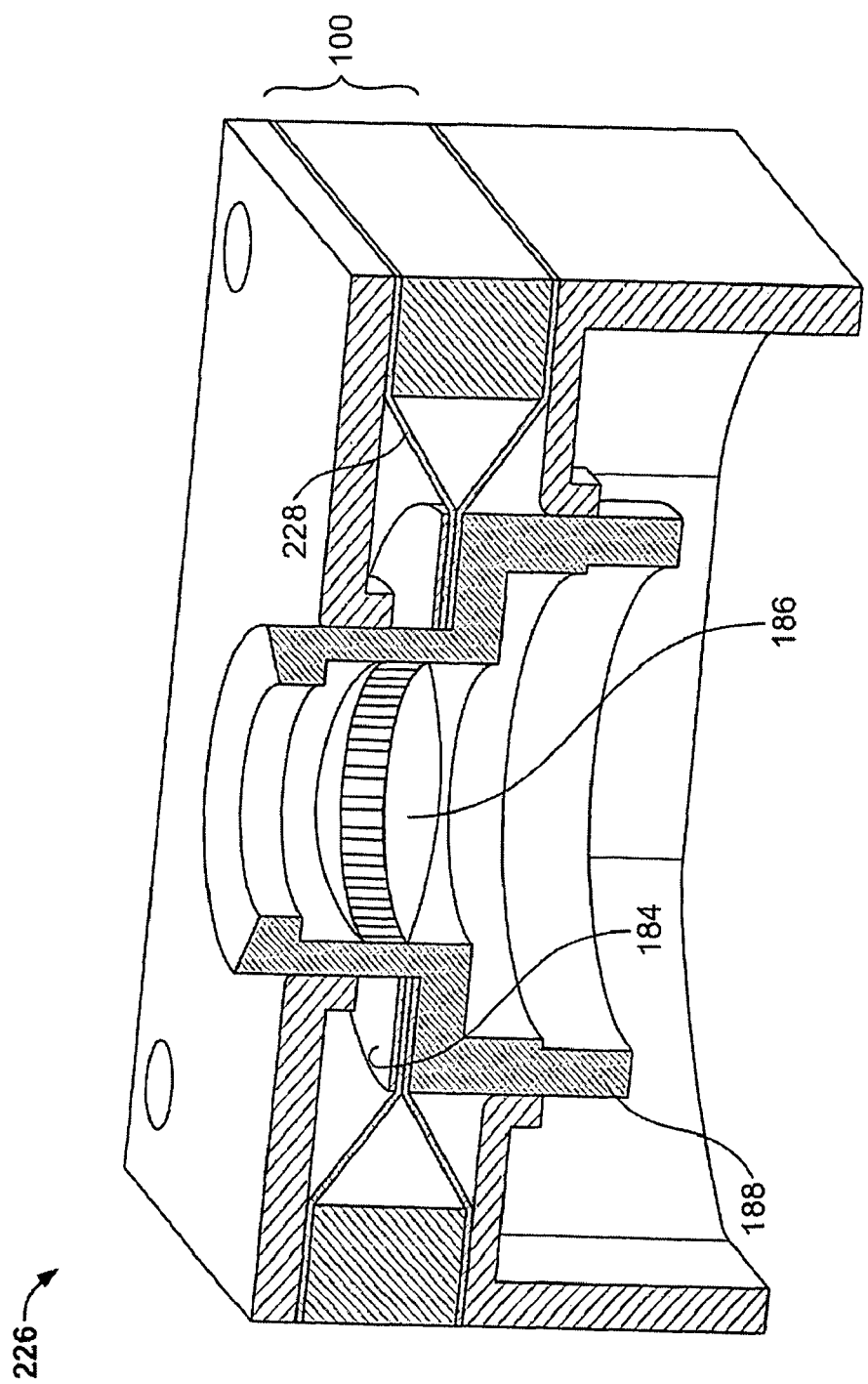
FIG. 20 is a sectional perspective view of a camera lens assembly employing another type of frustum actuator for focus control.

FIG. 20 shows another camera lens assembly 226. Instead of a leaf spring however, this design employs a double-frustum type actuator 100 in which the preload side of the device 228 may not be EPAM™ film, but simply an elastomeric web. Should side/layer 228 comprise EPAM™ material, however, it may most advantageously employed for sensing position by capacitance change.

Figure 21A:
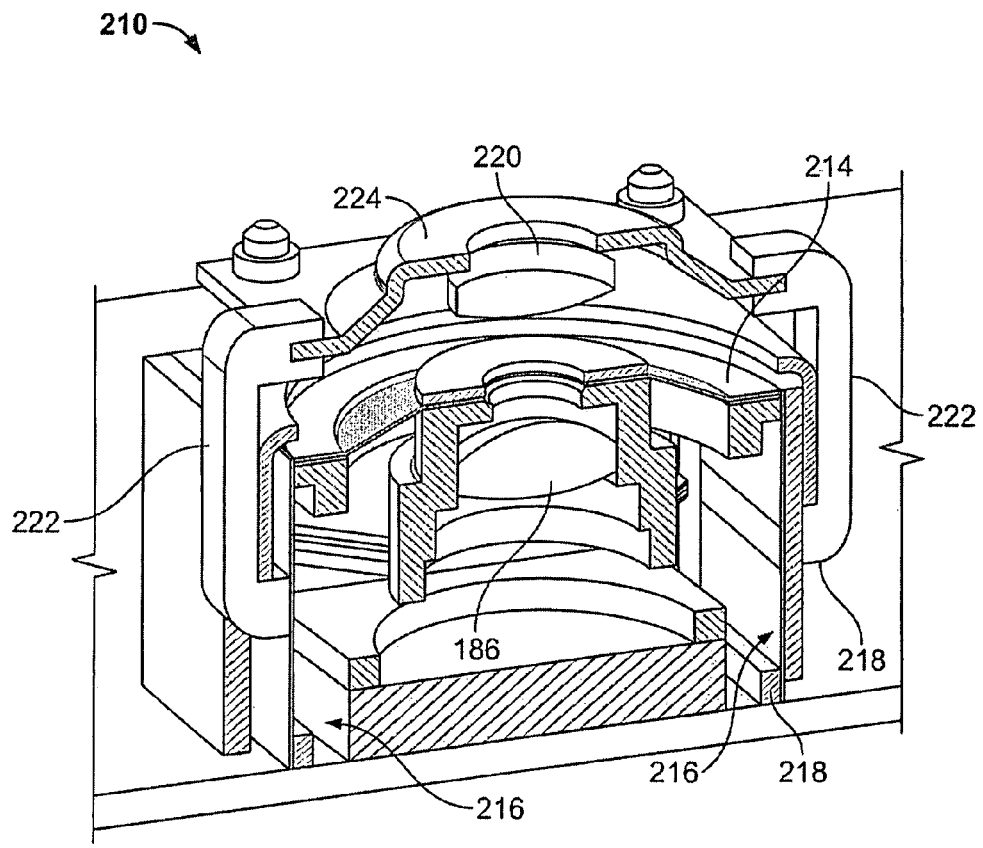
FIG. 21A is a sectional perspective view of another camera lens assembly employing an actuator combination to control each of zoom and focus.
Figure 21B:
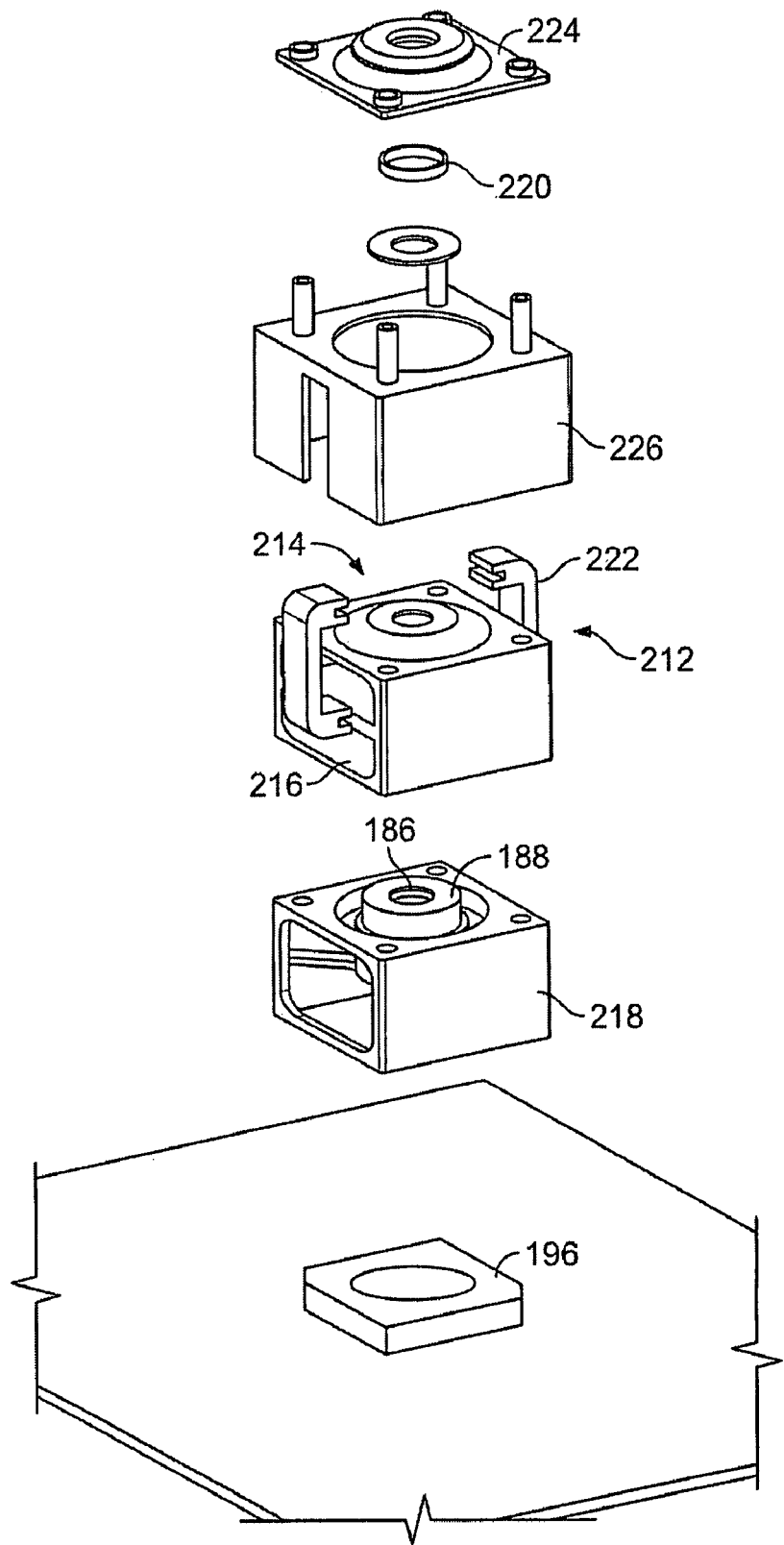
FIG. 21B is an assembly view of camera components with the system shown in FIG. 21A.

In another variation of the invention, FIG. 21A shows a camera lens assembly 210 employing an actuator combination 212 to control each of zoom and focus. As before, the device includes a focus stage driven by a diaphragm actuator 214 according to the present invention. In addition, the device includes a zoom stage set of planar actuators 216. Generally focus adjustment requires between 0.1 and 2.0 mm movement; zoom often requires 5 to 10 times that amount of stroke.

Accordingly, zoom is handled by a different type of actuator. In FIG. 21A, zoom function is actuated by a pair of planar-type transducers 216 located across from one another. Of interest is that each of the planar and diaphragm actuators are formed by EPAM™ film stretched over or upon a common frame element 218. Such functionality is offered by the two-lens arrangement shown. Zoom is accomplished varying the distance between lens 186 and lens 220. Bulk movement of lens 220 relative to lens 186 is accomplished by arms 222 connected to zoom lens frame 224.

A combined-use frame offers another option according to the invention that may be applied in any circumstance where bulk movement and fine tuning is required, or where (as in a camera) separate motion components are desired. Though not shown, it also is contemplated that multiple faces of a combined frame may carry diaphragm actuators alone or planar actuators alone. Still further, non-orthogonal frame geometry may be employed.

Regarding camera applications of the present invention, the aforementioned systems can be made extremely compact. As such, they are particularly suitable for use in compact digital or cell phone cameras, etc.

Figure 22A:
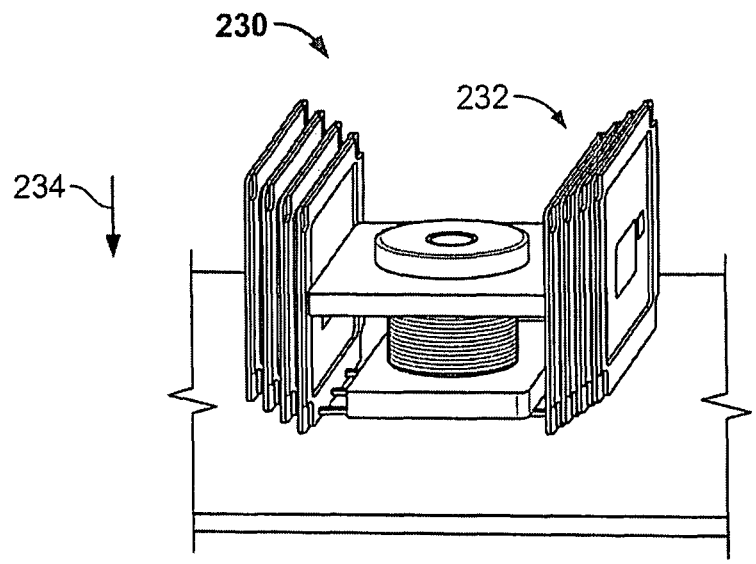
FIGS. 22A and 22B are perspective views showing an alternative means of controlling, zoom.
Figure 22B:
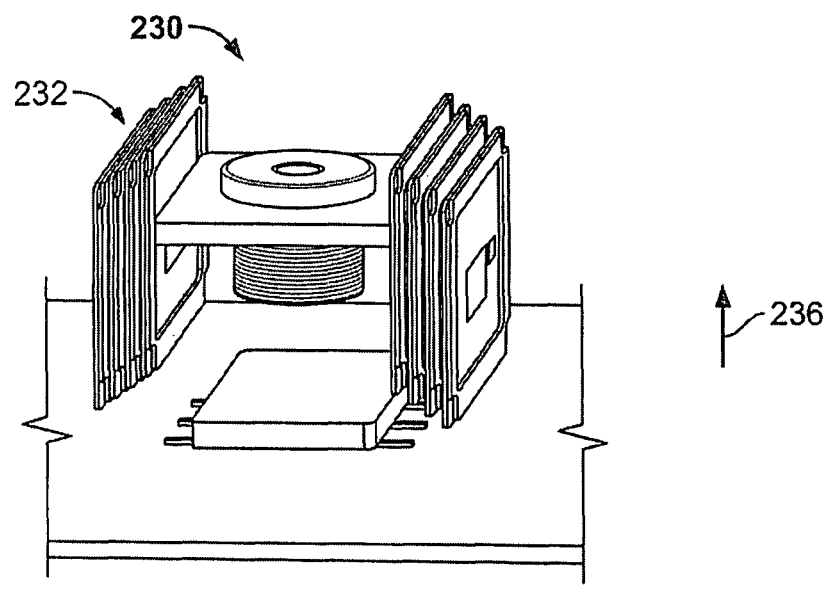

In cases where there is more available space, it may be desired to provide an EPAM™ zoom/focus engine suitable for longer zoom travel to increase the operating range of the device. FIGS. 22A and 22B are perspective views showing an alternative planar camera system 230 in which a telescopic arrangement 232 of planar actuators is provided for controlling zoom. These figures show minimum and maximum zoom positions as indicated by arrows 232 and 234, respectively.

Figure 23C:
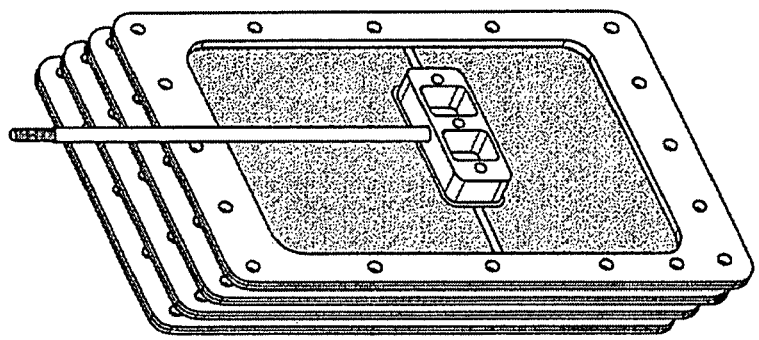
FIGS. 23A-23C are perspective views showing progressive stages of actuation of the transducer arrangement in FIGS. 22A and 22B.
Figure 23B:
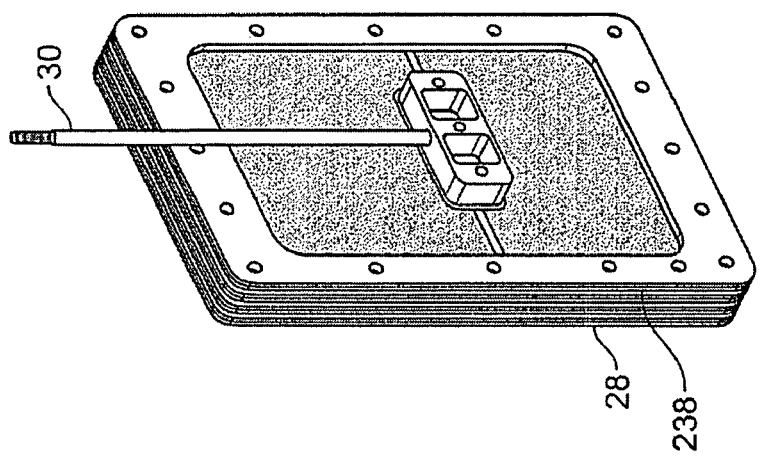
Figure 23A:
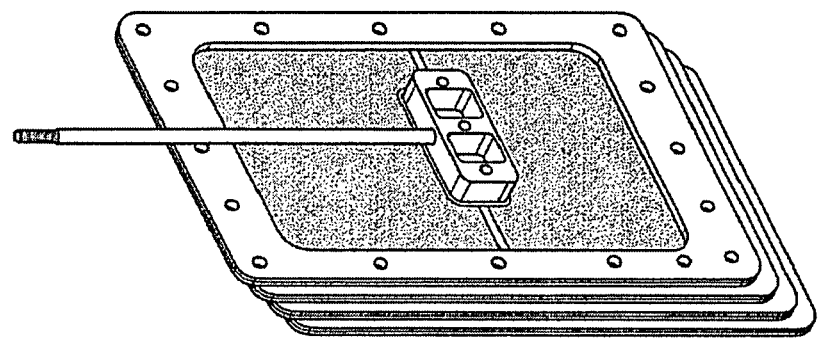

The manner in which the actuators are connected and operate is clarified by the enlarged section views provided by FIGS. 23A-23C showing stages of the transducer stack actuation. The progressive motion is achieve by connection of successive output bars 238 (partially hidden) to frame sections 20 with the final output bar 340 and attached rod 30 left to float or, rather, to drive zoom components.

The present invention further comprises a number of flow control means. These means include valves, mixers and pumps.

Figure 24A:
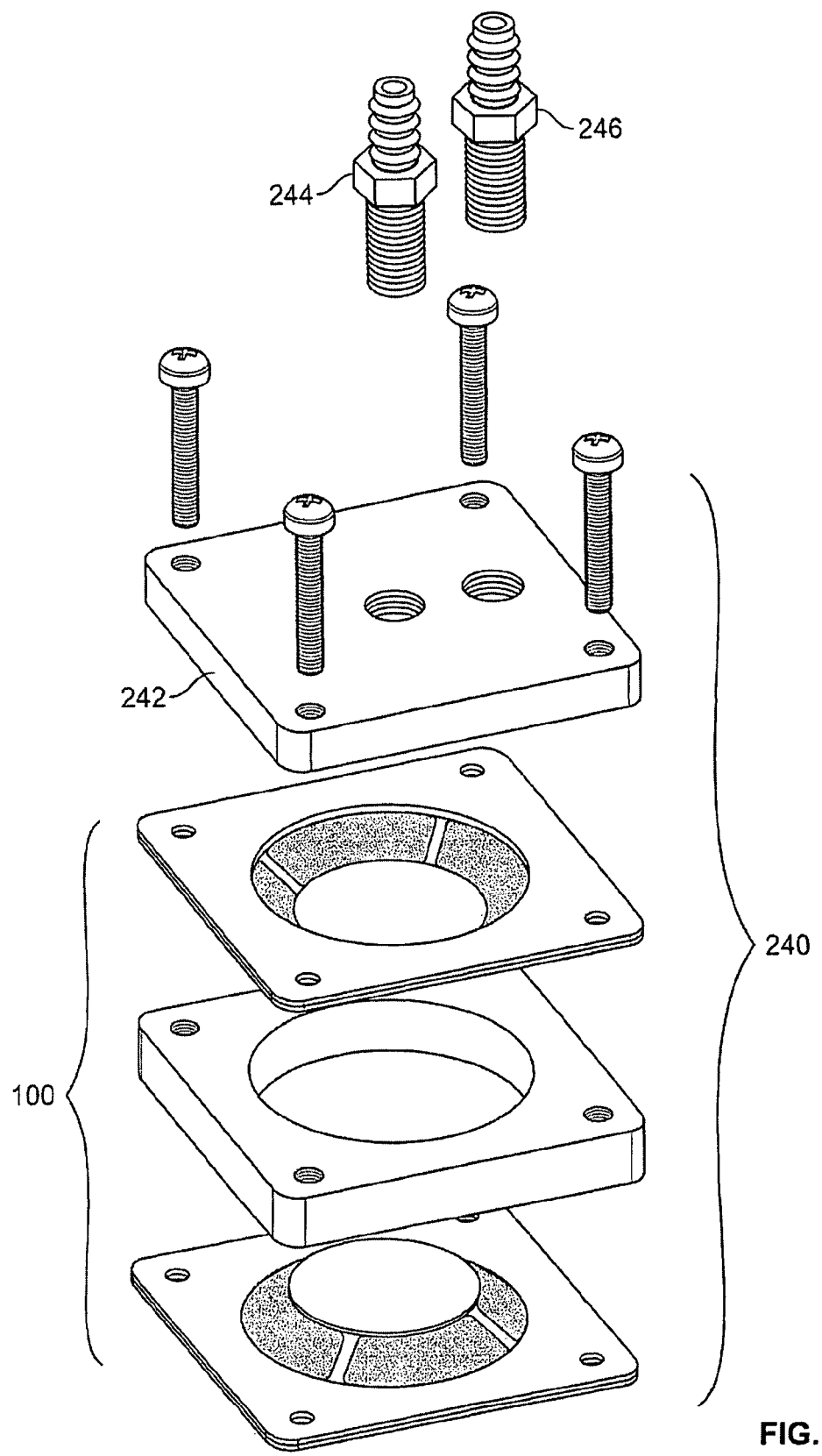
FIG. 24A is an assembly view of a valve mechanism.

FIG. 24A is an assembly view of a valve mechanism. Valve 240 comprises the elements the make up a double-frustum type actuator 100 as discussed above. Namely, valve comprises EPAM™ film stretched within frame members, and secured by cap(s). In addition, valve 240 includes a cover 242 with fittings 244, 246 received therein.

Figure 24B:
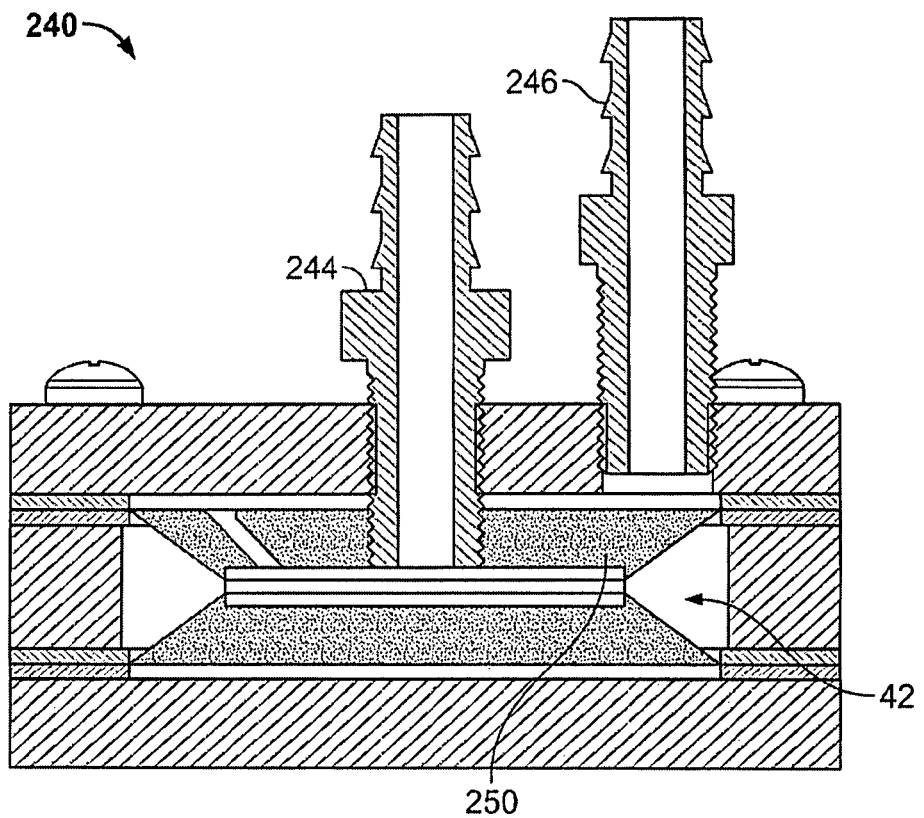
FIGS. 24B and 24C are side-sectional views of the valve in FIG. 24A illustrating valve actuation.
Figure 24C:
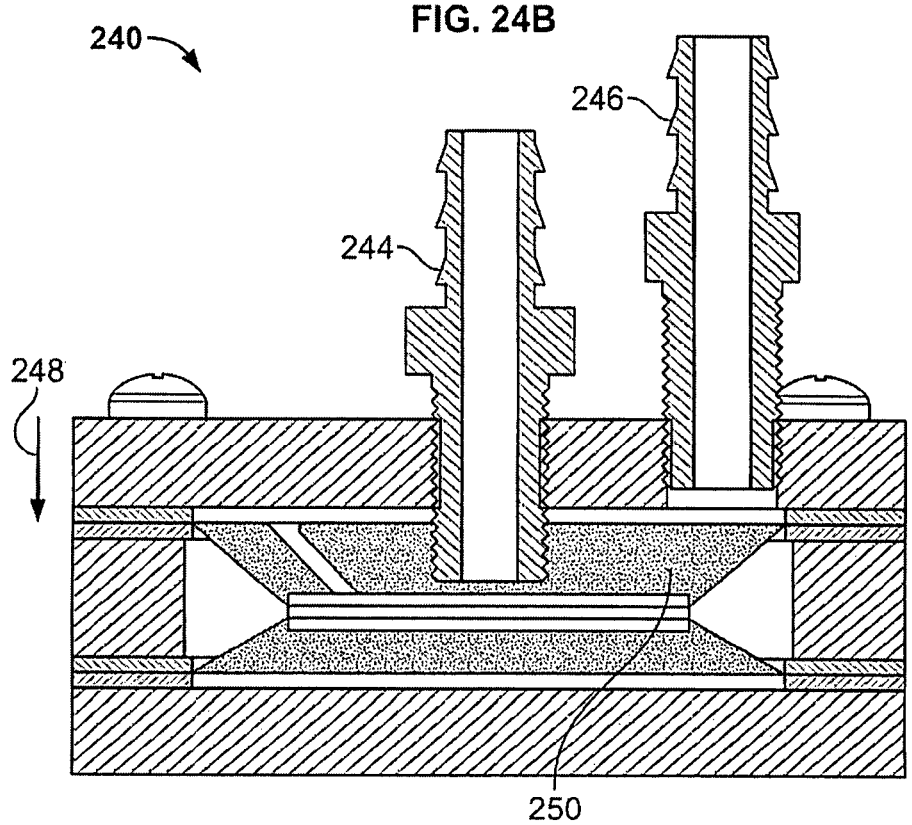

FIGS. 24B and 24C are side-sectional views of the valve in FIG. 24A illustrating valve actuation. In FIG. 24B the valve is closed. Cap/caps 42 serve as a diaphragm blocking the operative fitting 244 in an "normally closed" configuration in a neutral film (powered or unpowered) condition. In FIG. 24C, the valve is opened by actuating the transducer to drive cap 42 in the direction of arrow 248 to allow flow through a chamber 250 formed within the device.

Figure 25:
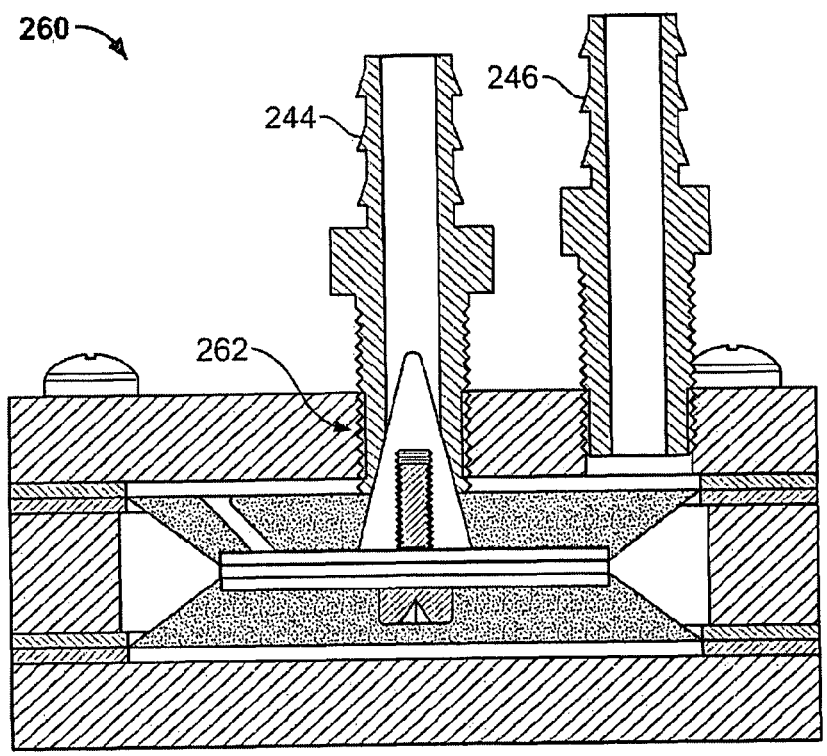
FIGS. 25-27 are side-sectional views of different valve configurations.

FIG. 25 shows another one-sided double-frustum diaphragm valve 260. The device differs only in that a tapered needle valve arrangement 262 is provided in order to offer a wider range of control.

Figure 26:
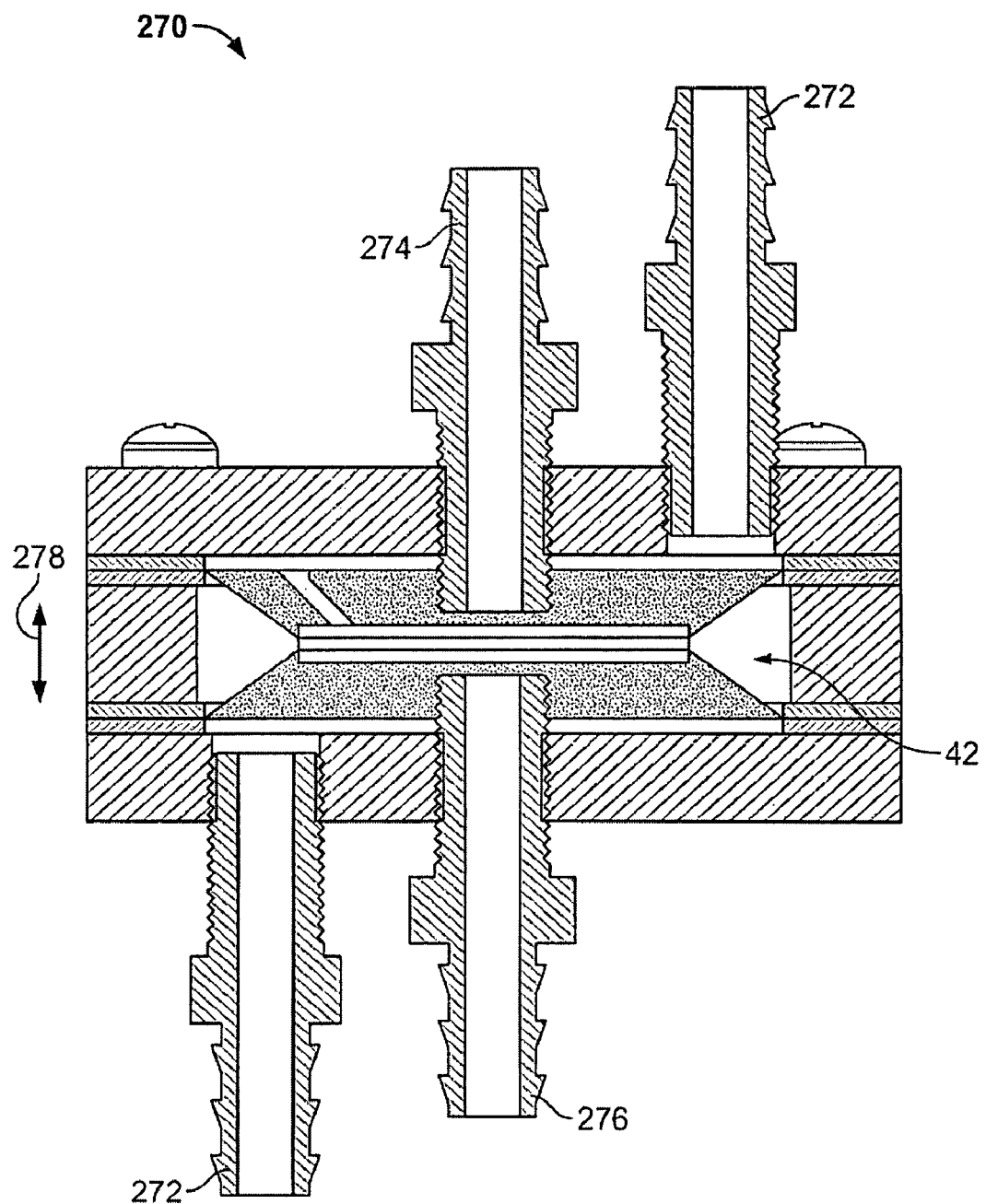

FIG. 26 shows a three-way mixing valve 270. Inlet fittings 272 are connected to lines (not shown) in fluid communication with to different fluid/gas sources (not shown). Exit fittings 274, 276 are connected to a common outlet line (not shown). The position of the cap/diaphragm 42 which may vary as indicated by double arrow 278 dictates the proportion of each different flow able to enter the exits fittings. Naturally, this device may also include tapered needle valves like the preceding device as may the other valves described herein.

Figure 27:
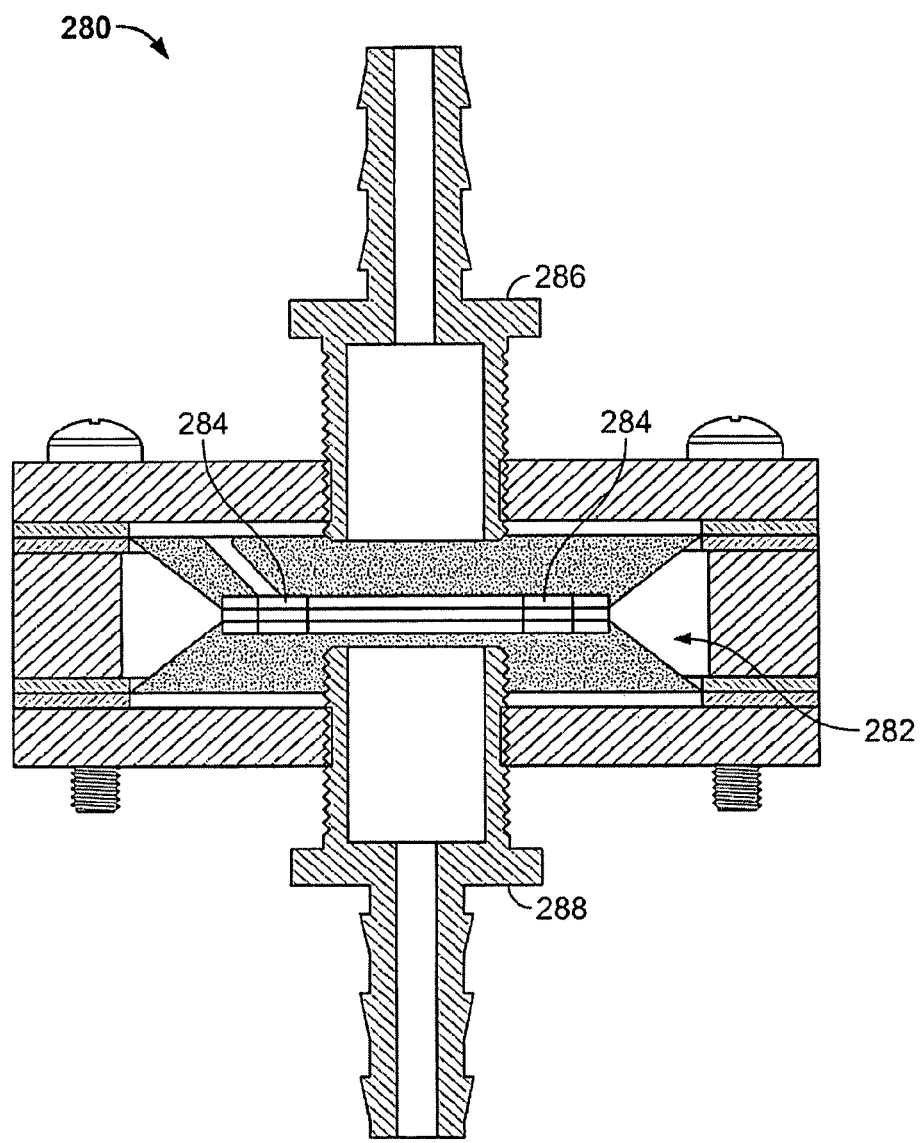

FIG. 27 shows an in-line valve 280. Where there previous valves employ an imperforate diaphragm, diaphragm 282 in this case includes through holes 284. In this manner, fluid is able to pass from one side of the device to the other through fittings 286, 288, where diaphragm 282 modulates the amount of flow able to pass by or into the operative fitting 288.

Figure 28:
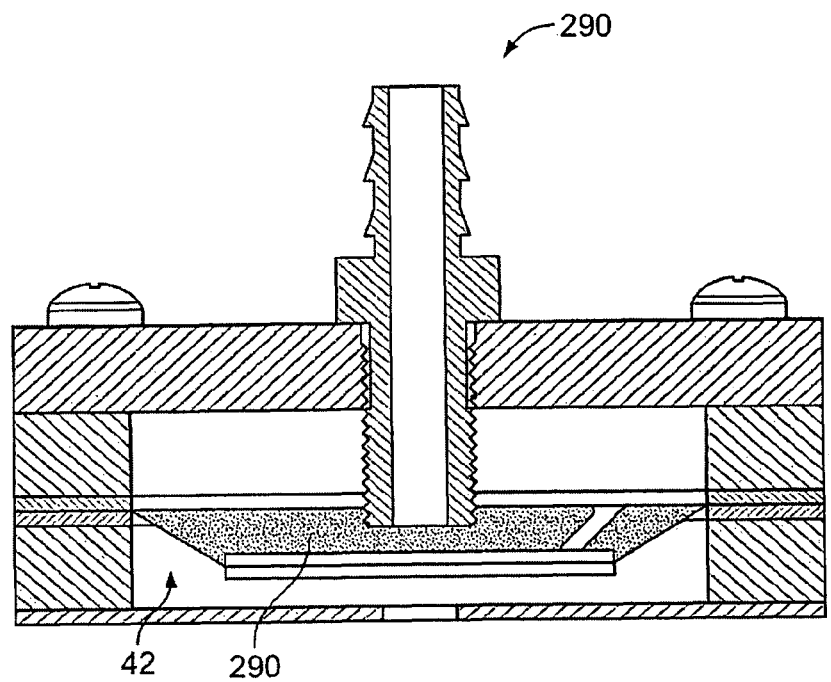
FIG. 28 is a side-sectional view of a pressure measurement transducer according to the invention.

FIG. 28 is a side-sectional view of a pressure measurement transducer 290 according to the invention. Fluid pressure entering a chamber 292 is sensed by correlation to changes in capacitance caused by stretching the EPAM™ film. As compared to a typical EPAM™ diaphragm transducer, cap 42 offers a new level of robustness to the system.

Figures 29A, 29B:
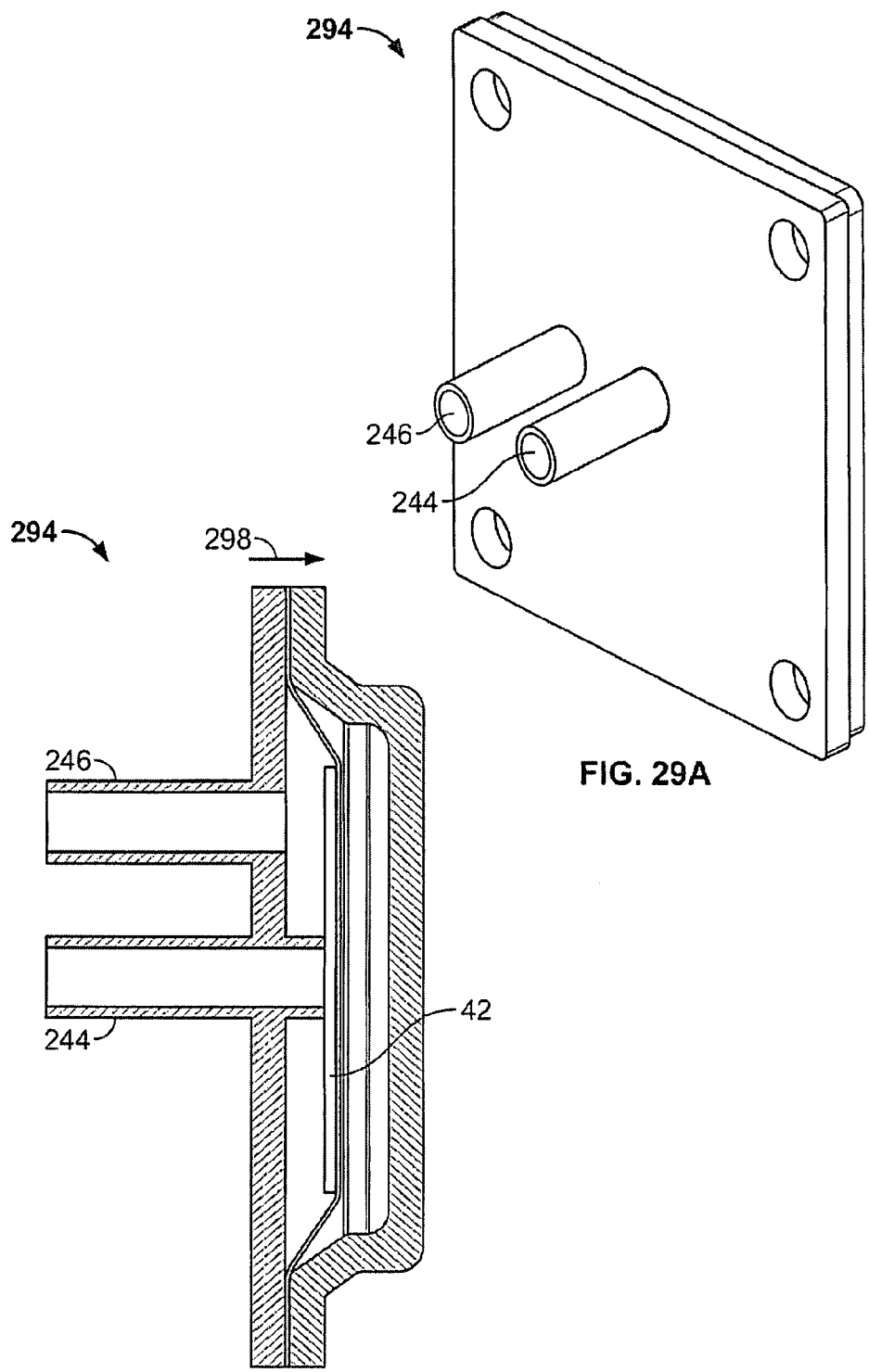
FIG. 29A is a side sectional view of an active check valve.
FIG. 29B is a perspective view of the structure shown in FIG. 29A.

FIGS. 29A and 298 illustrate a variable "cracking pressure" check valve 294. The EPAM™ material of actuator 296 is stretched so that cap seats at the distal end of valve stem 244 with some pressure. When voltage is applied to the material, it contracts in thickness, and extends in the direction of arrow 298, thus reducing the preload at the valve interface. When so-relaxed, fluid at a relatively lower pressure is able to escape past cap 42 (or valve needle, etc.) and exit through fitting 246.

Figure 30A:
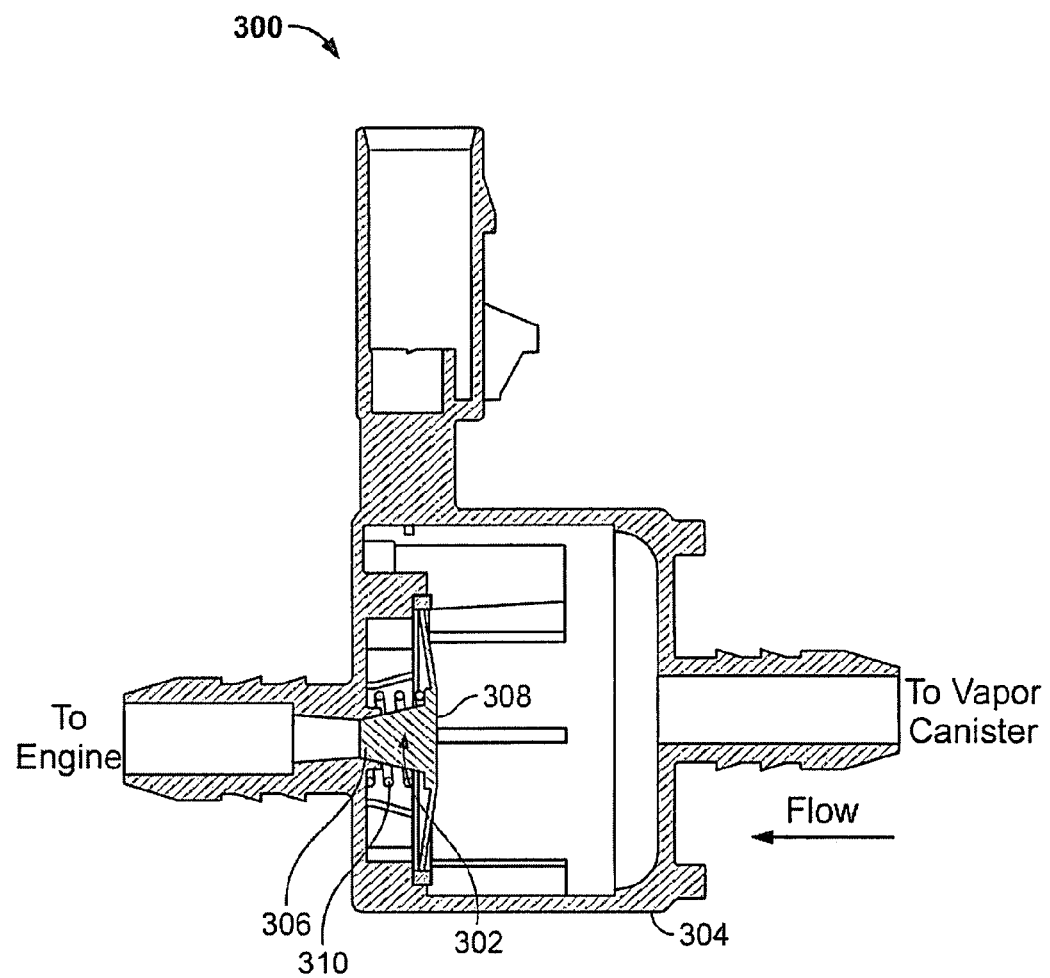
FIGS. 30A and 30B are side-sectional views of an inline valve set within an application-specific housing.
Figure 30B:
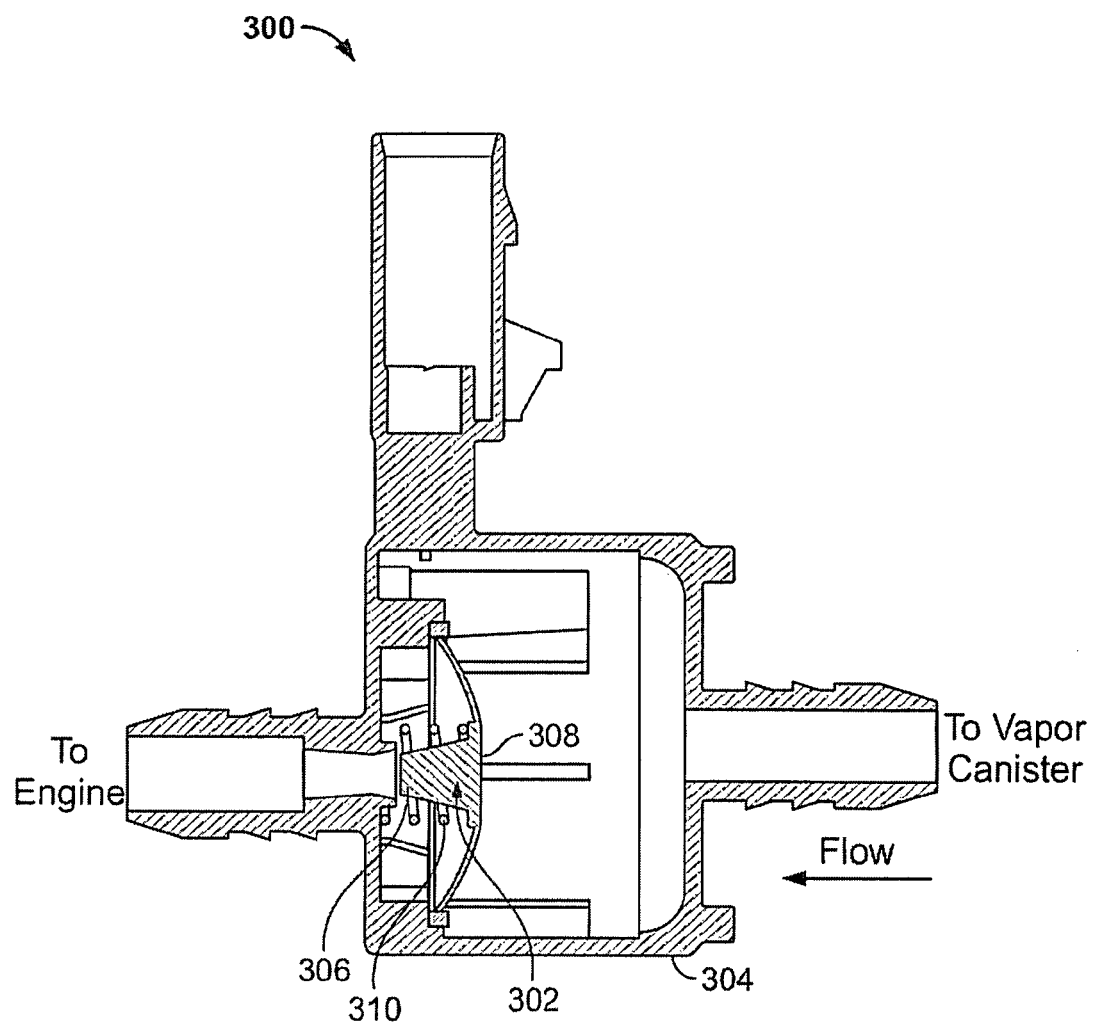

FIGS. 30A and 308 offer views of inline valve configuration 300 in which the frustum-type valve 302 is set within an application-specific housing 304. In this case, the housing is configured to replace a vapor canister purge valve used in internal combustion engine applications. FIG. 30A shows the valve in a closed configuration; FIG. 30B shows the valve in an open configuration. The valve is normally closed, and open upon voltage application to the EPAM™ film. The valve includes a stem 306 integrated with cap or diaphragm 308. Instead of a employing, a double-frustum design for bias, a coil spring 310 is employed in a single-sided design.

As for other applications of the subject systems a number of pumps are illustrated next. The pumps may be utilized for fluid or gas transfer under pressure, or used to generate vacuum. Valve structures mats be fit to the pump bodies or integrated therein/therewith.

Figure 31A:
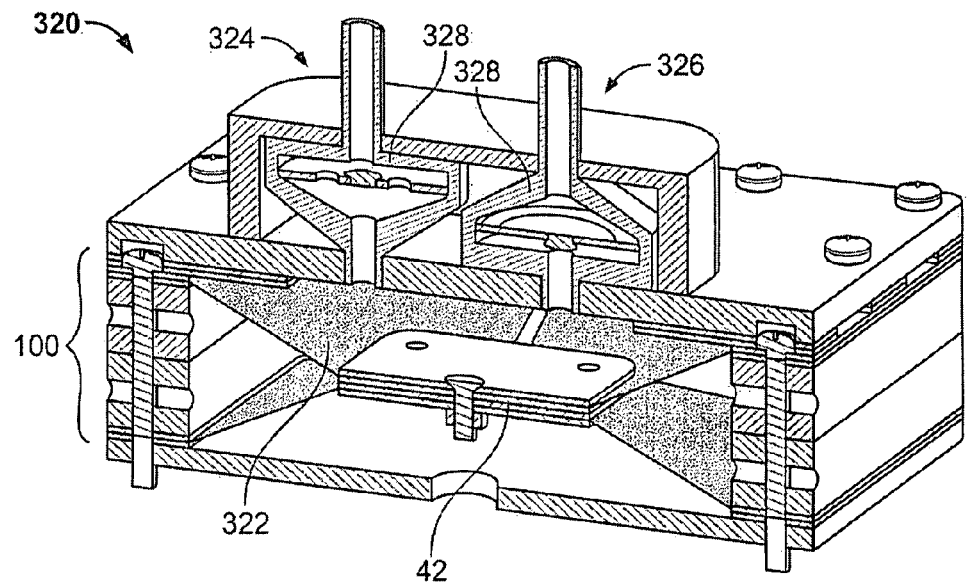
FIGS. 31A and 31B are sectional perspective views showing variations of a first pump employing frustum-type actuators.
Figure 31B:
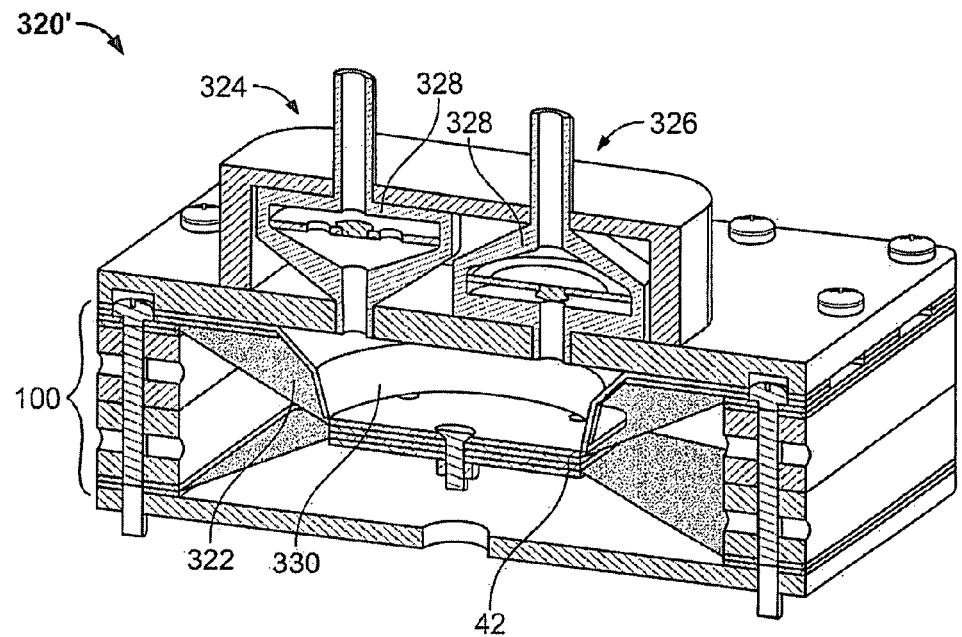

FIGS. 31A and 31B show variations of a first pump 320 and 320' employing double frustum-type actuators 100. Each device comprises a single chamber 322 diaphragm pump. The EPAM™ actuator section may be setup for single or two-phase actuation as discussed above in connection with the various double-frustum transducer designs. The pump includes a pair of passive check valves 324,326 in which movement of a membrane 328 urged by fluid (including gas) pressure alternatively opens and closes the valves as readily apparent.

Pump 320' in FIG. 31B is identical to that in FIG. 31A except that it includes a diaphragm wall 330 in addition to the cap/diaphragm 42 portion. Wall 330 provides an overall improved chamber wall interface (e.g., one the is less susceptible to elastic deformation, offering better material compatibility with caustic chemicals, etc.) than the EPAM™ film itself as employed in the previous pump variation.

Figure 32:
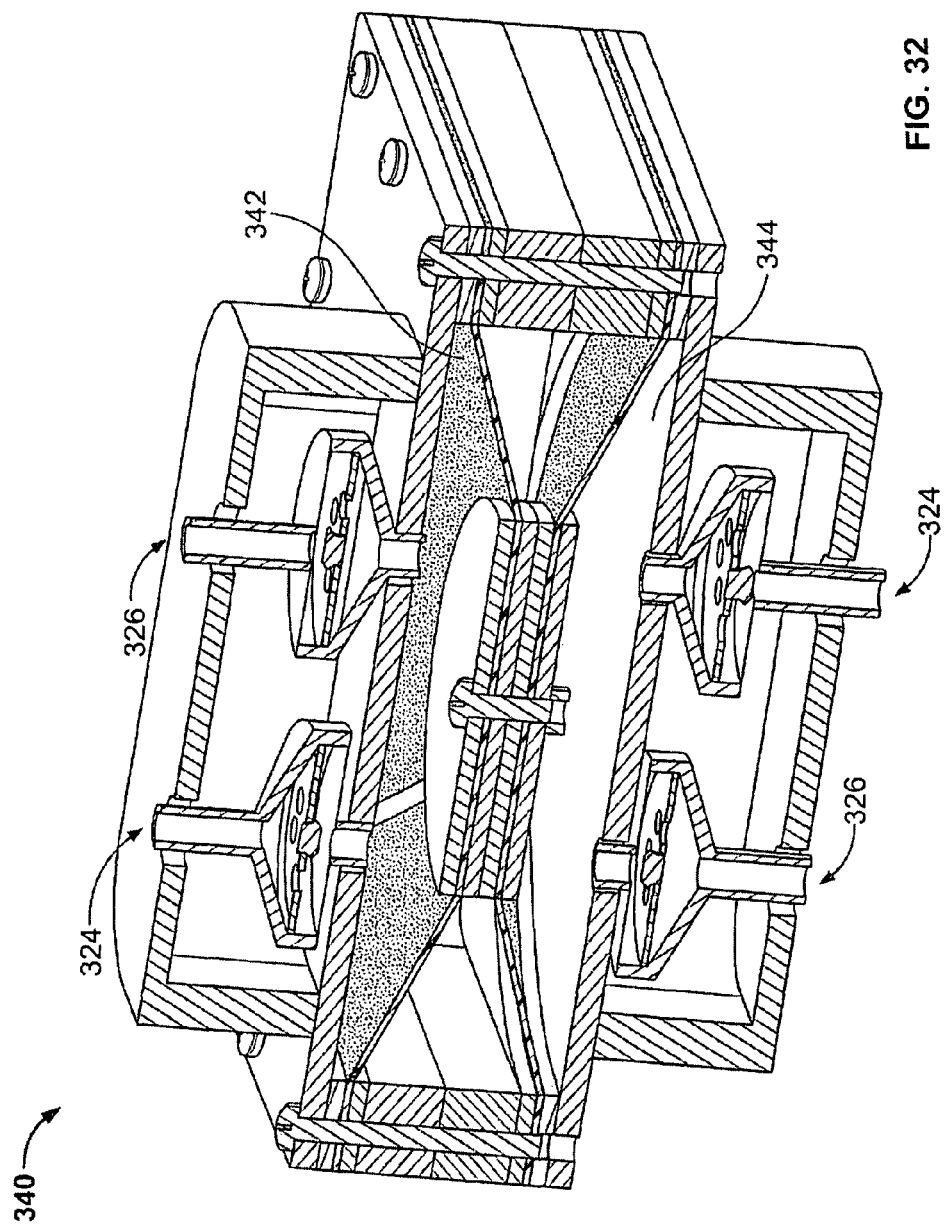
FIGS. 32 and 33 are sectional perspective views showing other pump variations employing frustum-type actuators.

Like the previous devices, pump 340 shown in FIG. 32 employs passive check valves 324, 326. It differs from the devices, however, in that it embodies an integrated double chamber 342, 344 or double-acting pump. Again, the actuator may be a one-phase or two-phase type transducer.

Figure 33:
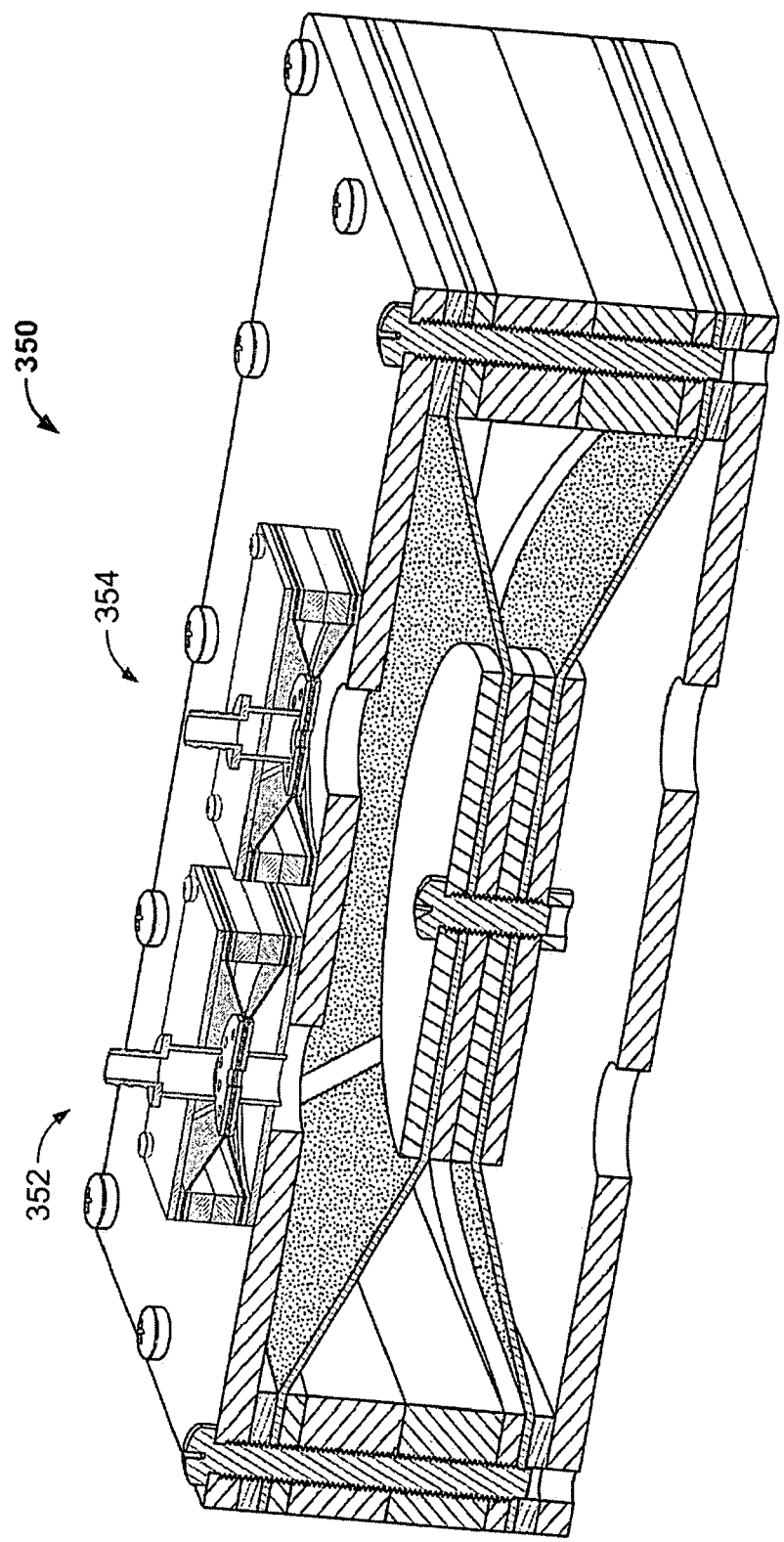

FIG. 33 shows a one chamber pump 350. Of course it could be reconfigured into a two-chamber design as in pump 340 in FIG. 32. Of interest, however, is that the check valves employed in this device are not passive, but rather EPAM™ valves 352, 354 similar to or as described above in connection with FIG. 28. Naturally, other EPAM™ valve configurations may be utilized (e.g., the arrangement shown in FIGS. 24A-24C).

Figure 34:
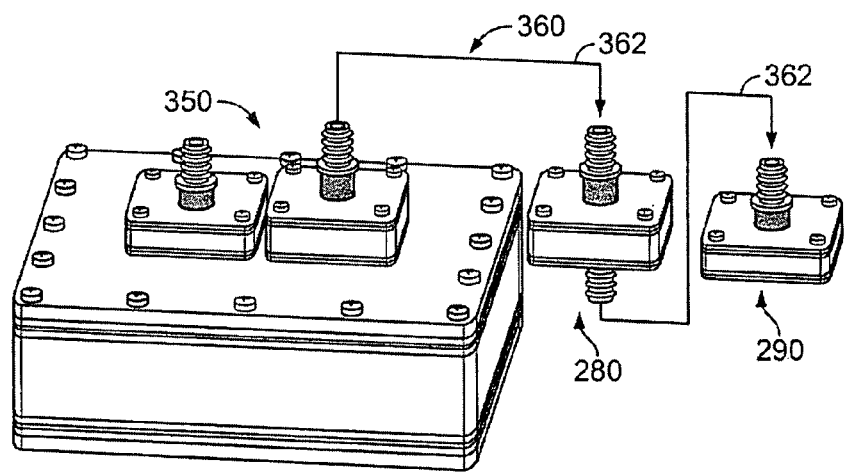
FIG. 34 is a perspective view of an integrated flow control system employing various of the valves and pumps illustrated above.

In essence, FIG. 33 offers one illustration of the assembly of various fluid flow subcomponents to create an integrated EPAM™ controlled device offering numerous advantages over known systems. FIG. 34 illustrates how the subject devices may be combined with themselves or other devices according to the present invention to offer a system of even greater utility. A "complete" fluid handling system 360 as illustrated in FIG. 34 comprises a pump 350, flow control valve 280 and/or a pressure sensor 290. Naturally, such a system will be plumbed with tubing as appropriate—perhaps as indicated by arrows 362. One potential application of such a system may be in filling or controlling the fill level of a bladder or reservoir (not shown) as a lumbar support in an automobile seat. Certainly, other applications and system configurations are possible as well. Generally speaking, pump chambers may be connected in series to increase pressure levels attained in pumping, or connected in parallel to increase pumping volume. An array of pumps may, likewise, be provided in using a combination of such connectivity.

Figure 35:
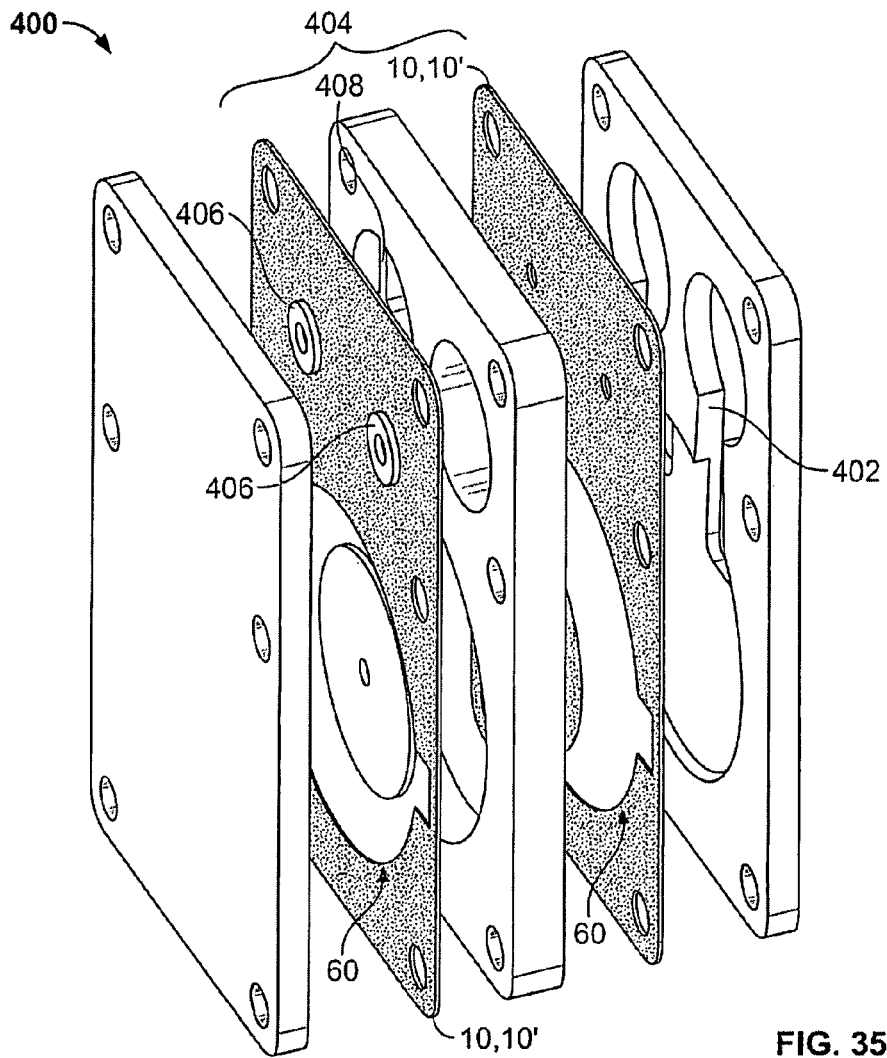
FIG. 35 is a perspective assembly view showing a pump housing with integrated check valves formed in conjunction with the pump diaphragm.

Still further, certain pump or flow connection features may be integrated into the design of the actuator itself. FIG. 35 provides an example of a pump 400 in which flow conduits 402 are integrated in the device structure. EPAM™ 10/10' film stretches to form each of the frustum/truncated diaphragm sections 60 and portions of check valves 404. Discs 406 are attached to the film and are preloaded against valve seats 408 by the tension in the film. Fluid flows through the centers of the discs when they lift off their seats. The discs 406 are bonded to the film, one on each side of the film.

Such a structure is highly advantageous from the perspective of using the same film to define both the pump and actuator in single flow system. Still further, by offsetting the valve structure to the side of the transducer body, the overall structure is minimized in thickness. This form-factor may be desired in certain applications where "thinner" designs are desired.

Figure 36:
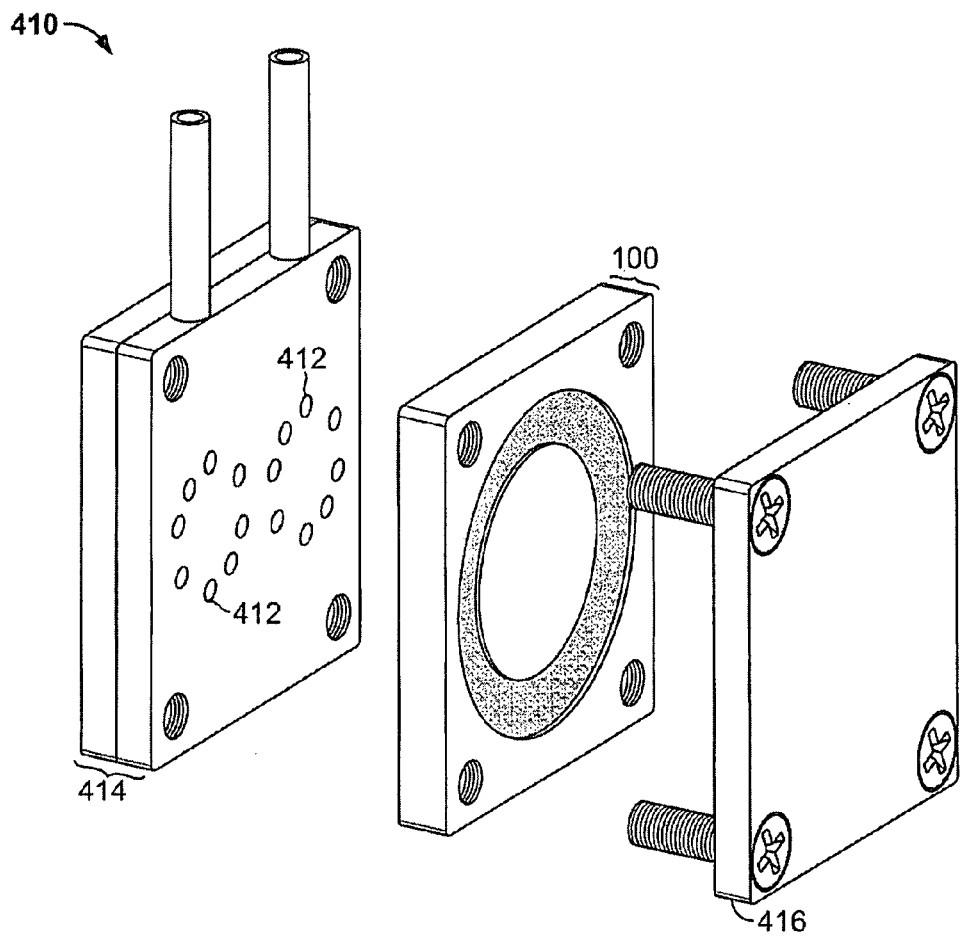
FIG. 36 is a perspective assembly view showing another pump assembly incorporating check valves.

FIG. 36 shows yet another example of a pump 410. Here, check valves 412 are formed in a side plate assembly 414 of a pump housing. Such a design offers a modular and compact approach for applying the basic transducer architecture in a pump application. Furthermore, this design offers potential for a smaller "footprint" as compared the design in FIG. 35. While a second side plate 416 may simply be provided to complete the assembly two check-valve type plates may instead be used to provide a double-acting pump similar in concept to that shown in FIG. 32.

Figure 37:
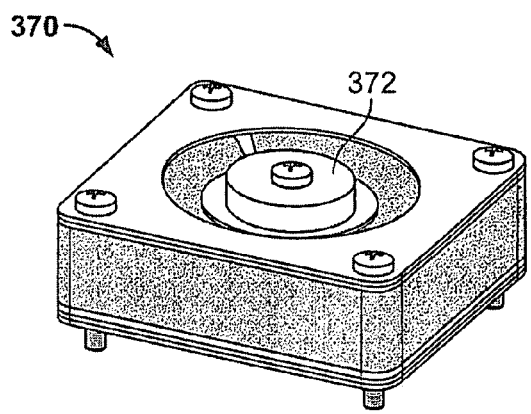
FIG. 37 is a perspective view of a vibrator element.

Regarding other potential applications of the subject technology, FIG. 37 shows a vibrator type device 370. In a double-frustum actuator configuration, reciprocal movement of a mass 372 is transmitted to a larger device housing connected to the transducer frame 26.

Figure 38:
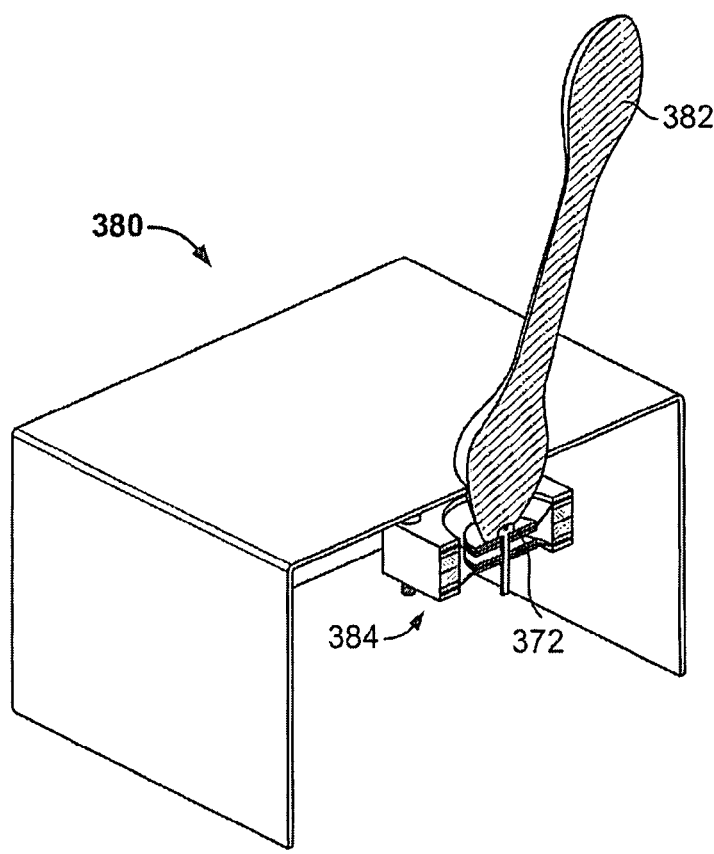
FIG. 38 is a sectional perspective view of a haptic feedback controller.

Whether or not a mass element is provided to generate vibration or not, another application of the subject transducer is shorten in FIG. 38 for a haptic feedback controller 380. The controller may be a game console device with a "joy stick" 382 that transmits vibration generator for tactile or force feedback to a user. In another variation, the joystick is attached to a multi-phase transducer 384 that by virtue of capacitance change upon deformation is able to sense or signal user manipulation in the user input or control means. Such a device would have applications ranging from game console construction to providing a surgeon a highly accurate interface to facilitate robotic surgery.

Figure 39:
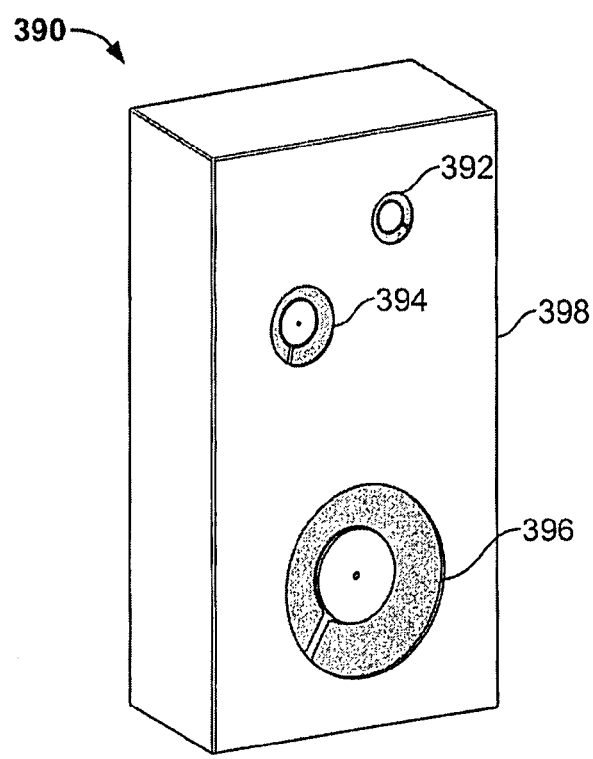
FIG. 39 is a perspective view on a speaker system employing a plurality of frustum and/or double-frustum transducers. Variation of the invention from that shown in the figures is contemplated.

Finally. FIG. 39 illustrates a variation of the present invention in which a speaker system 390 is provided that employs a plurality of frustum and/or double-frustum transducers 392, 394, 396. A "tweeter" driver 392 is smallest, followed by a larger "mid-range" driver 394 and finally by a large "woofer" driver 396. By virtue of the improved performance of the frustum geometry, both large and small (low and high frequency tuned) speaker can be produced. They can be driven at high power and still offer a light-weigh high performance speaker because no hefty magnets or coils are required as in typical electromagnetic speakers. What is more, the low profile of the transducers lend themselves to variation in speaker cabinet 398 design to offer uncompromised options in styling to the audiophile.

Manufacture

Regardless of the configuration selected for the subject transducers, various manufacturing techniques are advantageously employed. Specifically, it is useful to employ mask fixtures (not shorten) to accurately locate masks for patterning electrodes for batch construction. Furthermore, it is useful to employ assembly fixtures (not shown) to accurately locates multiple parts for batch construction. Other details regarding manufacture may be appreciated in connection with the above-referenced patents and publication as well as generally know or appreciated by those with skill in the art.

Methods

Methods associated with the subject devices are contemplated in which those methods are carried out with EPAM™ actuators. The methods may be performed using the subject devices or by other means. The methods may all comprise the act of providing a suitable transducer device. Such provision may be performed by the end user. In other words, the "providing" (e.g., a pump) merely requires the end user obtain, access, approach, position, set-up, activate, power-up or otherwise act to provide the requisite device in the subject method.

Kits

Yet another aspect of the invention includes kits having any combination of devices described herein—whether provided in packaged combination or assembled by a technician for operating use, instructions for use, etc.

A kit may include any number of transducers according to the present invention. A kit may include various other components for use with the transducers including mechanical or electrical connectors, power supplies, etc. The subject kits may also include written instructions for use of the devices or their assembly.

Instructions of a kit may be printed on a substrate, such as paper or plastic, etc. As such, the instructions may be present in the kits as a package insert, in the labeling of the container of the kit or components thereof (i.e., associated with the packaging or sub-packaging) etc. In other embodiments, the instructions are present as an electronic storage data file present on a suitable computer readable storage medium, e.g., CD-ROM, diskette, etc. In yet other embodiments, the actual instructions are not present in the kit, but means for obtaining the instructions from a remote source, e.g. via the Internet, are provided. An example of this embodiment is a kit that includes a web address where the instructions can be viewed and/or from which the instructions can be downloaded. As with the instructions, this means for obtaining the instructions is recorded on suitable media.

Variations

As for other details of the present invention, materials and alternate related configurations may be employed as within the level of those with skill in the relevant art. The same may hold true with respect to method-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. For example, adding a fastener or boss, complex surface geometry or another feature to a "diaphragm" as presented in the claims shall not avoid the claim term from reading on accused structure. Stated otherwise, unless specifically defined herein, all technical and scientific terms used herein are to be given as broad a commonly understood meaning as possible while maintaining claim validity.

The invention claimed is:

1. An electroactive polymer transducer driven speaker comprising:
   at least two of low, mid and high range drivers, each driver comprising an outer structure, an inner structure and electroactive polymer material stretched between the outer structure and the inner structure to form a diaphragm, wherein the diaphragm comprises a central portion that is less flexible than adjacent material,
   wherein the motion of the diaphragm upon application of voltage provides for output from the device and, wherein a cap attached to the diaphragm forms the less flexible central portion.

2. The speaker of claim 1, wherein the cap is substantially rigid.

3. The speaker of claim 1, comprising a plurality of diaphragms.

4. An electroactive polymer transducer driven vibrator comprising:
   an open frame and electroactive polymer material stretched to maintain a frustum shaped configuration within the frame to form a diaphragm, wherein the diaphragm comprises a central portion that is less flexible than adjacent material; and
   a weight attached to the central portion;
   wherein the motion of the diaphragm upon application of voltage provides for output from the vibrator to a user interface.

5. The device of claim 4, wherein the vibrator further comprises a second diaphragm which operates to sense input from the user interface.

* * * * *